(12) United States Patent
Liang et al.

(10) Patent No.: US 12,727,102 B2
(45) Date of Patent: Sep. 1, 2026

(54) MOTORIZED HINGE DRIVE DEVICE, HINGE DEVICE, AND ELECTRONIC DEVICE

(71) Applicant: AAC Microtech (Changzhou) Co., Ltd., Changzhou City (CN)

(72) Inventors: Junjie Liang, Changzhou (CN); Wenbiao Xu, Changzhou (CN)

(73) Assignee: AAC Microtech (Changzhou) Co., Ltd., Changzhou City (CN)

( * ) Notice: Subject to any disclaimer, the term of this patent is extended or adjusted under 35 U.S.C. 154(b) by 81 days.

(21) Appl. No.: 18/988,967

(22) Filed: Dec. 20, 2024

(65) Prior Publication Data

US 2026/0068066 A1 Mar. 5, 2026

Related U.S. Application Data

(63) Continuation of application No. PCT/CN2024/116919, filed on Sep. 4, 2024.

(51) Int. Cl.
*H05K 5/02* (2006.01)
*G06F 1/16* (2006.01)

(52) U.S. Cl.
CPC ......... *H05K 5/0226* (2013.01); *G06F 1/1681* (2013.01)

(58) Field of Classification Search
None
See application file for complete search history.

(56) References Cited

U.S. PATENT DOCUMENTS

2023/0269316 A1* 8/2023 Kim .................... H04M 1/0243 455/575.3

FOREIGN PATENT DOCUMENTS

CN 115981417 A * 4/2023
CN 116078881 A * 5/2023 .............. B21D 5/14

* cited by examiner

*Primary Examiner* — Kenneth Bukowski
(74) *Attorney, Agent, or Firm* — Wiersch Law Group

(57) ABSTRACT

Disclosed is a motorized hinge drive device, a hinge device, and an electronic device. The motorized hinge drive device includes: a lead screw and nut assembly, a first flip drive assembly, a second flip drive assembly, a spring assembly, and a motor assembly. The lead screw and nut assembly includes two lead screws arranged oppositely and a nut simultaneously fitted on both of the two lead screws. The first flip drive assembly includes a first slider simultaneously sleeved on the two lead screws and two first rotation arms that are oppositely arranged and are respectively sleeved on the two lead screws. The second flip drive assembly includes a second slider simultaneously sleeved on the two lead screws and two second rotation arms that are oppositely arranged and are respectively sleeved on the two lead screws. The present disclosure achieves automatic unfolding and folding, and achieves good hovering stability.

19 Claims, 43 Drawing Sheets

A-A

MOTORIZED HINGE DRIVE DEVICE, HINGE DEVICE, AND ELECTRONIC DEVICE

The present application is a continuation of PCT Patent Application No. PCT/CN2024/116919, entitled "MOTORIZED HINGE DRIVE DEVICE, HINGE DEVICE, AND ELECTRONIC DEVICE," filed Sep. 4, 2024, which is incorporated by reference herein in its entirety.

TECHNICAL FIELD

The present disclosure relates to the technical field of electronic devices, and in particular, to a motorized hinge drive device, a hinge device, and an electronic device.

BACKGROUND

With the advent of the mobile Internet era, a drastically increasing number of smart mobile devices are being used. Among a variety of mobile devices, foldable electronic devices, such as foldable phones, foldable tablets, and laptops, are favored by consumers due to their portability and large display screens. These foldable electronic devices achieve their folding function via hinges. Typically, foldable electronic devices have diversified usage states, such as a folded state, an unfolded state, and a hovering state (a state between the folded and unfolded positions). For stability of the devices in different folded states, some additional rotational resistance and locking forces are typically manually added to the hinge mechanism, such as a friction resistance, a mechanical locking force, and a magnetic locking force. In this case, manual flipping may be quite labor-intensive, leading to a poor user experience, especially when opening from the folded state or folding from the unfolded state, as a significant locking force needs to be overcome.

In related arts, an electronic device typically includes a first body, a second body, and a hinge configured to connect the first body to the second body. By incorporating a motor into the hinge and driving the hinge using the motor, the hinge can automatically open and close, thereby adjusting the opening and closing of the first and second bodies. This improves the opening and closing experience of the foldable electronic device.

However, in the aforementioned electronic device, a rotational play between the first body and second body is large, and these bodies are prone to wobbling even under a slight external force. The first body and the second body are indirectly connected for rotational movement via a friction connector and a motor assembly. Each level of connection within the motor assembly is subjected to a specific amount of rotational clearance, and the clearances exert a cumulative effect, ultimately resulting in a significant rotational play between the first body and the second body. Consequently, a poor use experience is caused for the electronic device.

Therefore, it is desired to provide a new motorized hinge drive device to address the above problem.

SUMMARY

An object of the present disclosure is to provide a motorized hinge drive device which is capable of automatically unfolding or folding and achieving good hovering stability.

Accordingly, in a first aspect, embodiments of the present disclosure provide a motorized hinge drive device. The motorized hinge drive device includes: a lead screw and nut assembly, a first flip drive assembly, a second flip drive assembly, a spring assembly, and a motor assembly; wherein the lead screw and nut assembly includes two lead screws arranged oppositely and a nut simultaneously fitted on both of the two lead screws, wherein the two lead screws are threadedly transmissively connected to the nut, and the two lead screws are transmissively connected to the motor assembly; the second flip drive assembly and the first flip drive assembly are positioned on opposite sides of the nut or a same side of the nut; and the second flip drive assembly and the first flip drive assembly are axially clamped at two ends of the two lead screws; the first flip drive assembly includes a first slider simultaneously sleeved on the two lead screws and two first rotation arms that are oppositely arranged and are respectively sleeved on the two lead screws; wherein the first slider and the first rotation arm are successively stacked along an axial direction of the lead screws towards a direction away from the second flip drive assembly, and the first slider is slidably connected to the lead screws along the axial direction of the lead screws; and a first contact surface is defined on a side, close to the first rotation arm, of the first slider, and a second contact surface is defined on a side, close to the first slider of the first rotation arm, the first contact surface being in abutment against the second contact surface, and the first slider presses against the first rotation arm to cause the first rotation arm to rotate along the first lead screw towards a first flipping direction, the first flipping direction being an unfolding direction or a folding direction; the second flip drive assembly includes a second slider simultaneously sleeved on the two lead screws and two second rotation arms that are oppositely arranged and are respectively sleeved on the two lead screws; wherein the second slider and the second rotation arm are successively stacked along an axial direction of the lead screws towards a direction away from the first flip drive assembly, and the second slider is in sliding connection with the lead screw along the axial direction of the lead screws; a third contact surface is defined on a side, close to the second rotation arm, of the second slider, and a fourth contact surface is defined on a side, close to the second slider of the second rotation arm, the third contact surface being in abutment against the fourth contact surface, and the second slider presses against the second rotation arm to cause the second rotation arm to rotate along the lead screws towards a second flipping direction, the second flipping direction being opposite to the first flipping direction; and the spring assembly is clamped between the first slider and the second slider, and is provided with a pre-load force; and the lead screws are driven by the motor assembly to drive the nut to move along the axial direction of the lead screws, such that the nut presses against the first slider or the second slider to enable rotation of the first rotation arm and the second rotation arm.

In some embodiments, the spring assembly includes a first spring and a second spring; wherein the first spring is clamped between the first slider and the nut, and the second spring is clamped between the first slider and the nut.

In some embodiments, the motorized hinge drive device further includes a pull rod secured to the nut; wherein a securing shoulder is arranged at each of two ends of the pull rod, the pull rod successively passes through the first slider, the nut, and the second slider, and the two ends of the pull rod are respectively in abutment against sides, away from the nut, of the first slider and the second slider, and the first spring and the second spring are respectively sleeved on the pull rod.

In some embodiments, the pull rod includes a pull rod body, a first shaft collar protruding from one end of the pull rod body, a securing groove formed by a recess in a middle portion of the pull rod body, and a first recess formed in the other end of the pull rod body; and the nut includes a nut body, two female thread structures formed through the nut body, and a bayonet extending through the nut body; wherein the two lead screws respectively pass through the two female thread structures and are threadedly connected to the two female thread structures, and the bayonet is engaged in the securing groove, the first spring is sleeved around the pull rod body and positioned between the first slider and the nut body, the second spring is sleeved around the pull rod body and positioned between the second slider and the nut body, and a first retaining ring is arranged within the first recess, wherein the first retaining ring is in abutment against a side, away from the nut, of the first slider, and a side, away from the nut, of the second slider is in abutment against the first shaft collar.

In some embodiments, the motorized hinge drive device further includes: a pull rod; wherein the pull rod includes two pull rod bodies secured to two opposite sides of the nut and two securing shoulders formed by bending and extending an end portion, away from the nut, of the pull rod body along the axial direction of the lead screws, wherein the two pull rod bodies are arranged along the axial direction of the lead screws; and the nut includes a nut body, two female thread structures formed through the nut body, and a mounting slot extending through the nut body and positioned between the two female thread structures, wherein the two lead screws respectively pass through the two female thread structures and are threadedly connected to the two female thread structures, the spring assembly is arranged within the mounting slot, and two ends of the spring assembly are respectively in abutment against the two securing shoulders.

In some embodiments, each of the lead screws includes a lead screw body, a male thread structure formed through the lead screw body, a second shaft collar protruding from one end of the lead screw body, and a second recess formed in the other end of the lead screw body, wherein the nut is threadedly connected to the male thread structure, a second retaining ring is arranged within the second recess; wherein each of the first rotation arms is sleeved around one of the lead screw bodies and is in abutment against a corresponding second retaining ring, and each of the second rotation arms is sleeved on the other end of one of the lead screw bodies and is in abutment against a corresponding second shaft collar.

In some embodiments, the motor assembly includes a motor, a reducer transmissively connected to an output shaft of the motor, and a transmission assembly transmissively connected to the reducer; wherein the transmission assembly is transmissively connected to the lead screws.

In some embodiments, the transmission assembly is a gear transmission assembly.

In some embodiments, the first slider and the two first rotation arms are defined as a first flipping unit, and the second slider and the two second rotation arms are defined as a second flipping unit, one said first flipping unit and one said second flipping unit being arranged; and a contact surface between the first slider and the two first rotation arms is a helical surface, and a contact surface between the second slider and the two second rotation arms is a helical surface.

In some embodiments, at least two said first flipping units and at least two said second flipping units are arranged; wherein adjacent two of the first flipping units are arranged in a mirror-image configuration along a direction perpendicular to the axial direction of the lead screws, and adjacent two of the second flipping units are arranged in a mirror-image configuration along a direction perpendicular to the axial direction of the lead screws; wherein a contact surface between the first slider of at least one of the first flipping units and the two first rotation arms is a helical surface, and a contact surface between the second slider of at least one of the second slipping units and the two second rotation arms is a helical surface.

In some embodiments, the first sliders between the adjacent two of the first flipping units are integrally formed, and the second sliders between the adjacent two of the second flipping units are integrally formed.

In some embodiments, the first rotation arms between the adjacent two of the first flipping units are integrally formed, and the second rotation arms between the adjacent two of the second flipping units are integrally formed.

In some embodiments, the first flip drive assembly and the second flip drive assembly achieve axial clamping by arranging axial securing shoulders at the two ends of the lead screw, or by securely connecting the rotation arms on a same side at a top portion of the first flip drive assembly and a bottom portion of the second flip drive assembly, or by securely connecting the sliders at a top portion of the first flip drive assembly and a bottom portion of the second flip drive assembly.

In some embodiments, in the case that the second flip drive assembly and the first flip drive assembly are positioned on a same side of the nut, the motorized hinge drive device further includes a connection beam; wherein the first flip drive assembly, the second flip drive assembly, and the nut that are successively arranged along the axial direction of the lead screws are securely connected to the lead screws via the connection beam.

In a second aspect, embodiments of the present disclosure provide a hinge device. The hinge device includes: a framework, two connection arms oppositely arranged, and the motorized hinge drive device as described above; wherein the motorized hinge drive device is mounted on the framework, a first rotation arm and a second rotation arm of the motorized hinge drive device are both connected to an external device, and two ends of each of the two connection arms is in transmissive connection to the framework and the external device.

In some embodiments, the first rotation arm and the second rotation arm are rotatably or slidably connected to the external device.

In a third aspect, embodiments of the present disclosure provide a hinge device. The hinge device includes: a framework and the motorized hinge drive device as described above; wherein the motorized hinge drive device is mounted on the framework, a first rotation arm and a second rotation arm of the motorized hinge drive device are both in secure connection to the external device.

In a fourth aspect, embodiments of the present disclosure provide a hinge device. The hinge device includes: a framework, two connection arms oppositely arranged, and the motorized hinge drive device as described above; wherein the motorized hinge drive device is mounted on the framework, a first rotation arm and a second rotation arm of the motorized hinge drive device are both in a slider slot connection to an external device, one end of each of the two connection arms is in rotatable connection to the framework, and the other end of the connection arm is in secure connection to the external device.

In a fifth aspect, embodiments of the present disclosure provide an electronic device. The electronic device includes: a first body, a second body, a triggering module, a smart controller, and the hinge device as described above; wherein the triggering module and the smart controller are respectively mounted within the first body and/or the second body; and the hinge device is connected to the first body and the second body; the triggering module is configured to generate a trigger signal in response to an operation by a user; and the smart controller is configured to, based on the trigger signal, control the hinge device to operate.

In some embodiments, the triggering module includes at least one or a combination of two or more of a key module, a fingerprint recognition module, an image acquisition module, or a voice input module.

In some embodiments, the electronic device further includes: a sensor; wherein the sensor is configured to detect a relative position and a relative motion state of the first body and the second body, and/or an acting force exerted by the hinge device to the first body and/or the second body; and the smart controller is configured to, based on information detected by the sensor, determine usage of the electronic device, output a corresponding motor control signal, control the hinge device to operate, and assist the user to operate the electronic device.

As compared with the related art, in the motorized hinge drive device according to the present disclosure, the second flip drive assembly and the first flip drive assembly are positioned on opposite sides of the nut or a same side of the nut, and are axially clamped at two ends of the two lead screws, such that the motor assembly drives the lead screw and nut assembly to compress the spring assembly to drive the first flip drive assembly to flip towards the first flipping direction or drive the second flip drive assembly to flip towards the second flipping direction; the two lead screws are threadedly transmissively connected to the nut and are transmissively connected to the motor assembly, the first slider and the first rotation arm are successively stacked along the axial direction of the lead screws towards the direction away from the nut, and the first slider is slidably connected to the lead screws along the axial direction of the lead screws; the first contact surface is defined on the side, close to the first rotation arm, of the first slider, the second contact surface is defined on the side, close to the first slider of the first rotation arm, the first contact surface is in abutment against the second contact surface, and the first slider presses against the first rotation arm to cause the first rotation arm to rotate towards the first flipping direction; the second flip drive assembly and the first flip drive assembly are respectively on two opposite sides of the nut, the second slider and the second rotation arm are successively stacked along the axial direction of the lead screws towards the direction away from the nut, the second slider is slidably connected to the lead screws along the axial direction of the lead screws; the third contact surface is defined on the side, close to the second rotation arm, of the second slider, the fourth contact surface is defined on the side, close to the second slider, of the second rotation arm, the third contact surface is in abutment against the fourth contact surface, and the second slider presses against the second rotation arm to cause the second rotation arm to rotate along the lead screws towards the second flipping direction, and the first flipping direction is opposite to the second flipping direction; the spring assembly is clamped between the first slider and the second slider and is provided with the pre-load force, and the lead screws are driven by the motor assembly to drive the nut to move along the axial direction of the lead screws, such that the nut presses against the first slider or the second slider to enable rotation of the first rotation arm and the second rotation arm. In this way, it is convenient to achieve automatic unfolding and folding of the electronic device, the output torque of the motor is amplified, the hovering resistance during automatic opening and closing is automatically decreased, which lowers the requirement on the torque of the motor, and during hovering, the flipping resistance is large, and hence the hovering stability is enhanced.

BRIEF DESCRIPTION OF THE DRAWINGS

For clearer descriptions of the technical solutions according to the embodiments of the present disclosure, drawings that are to be referred for description of the embodiments are briefly described hereinafter. Apparently, the drawings described hereinafter merely illustrate some embodiments of the present disclosure. Persons of ordinary skill in the art may also derive other drawings based on the drawings described herein without any creative effort.

DETAILED DESCRIPTION

Figure 1:
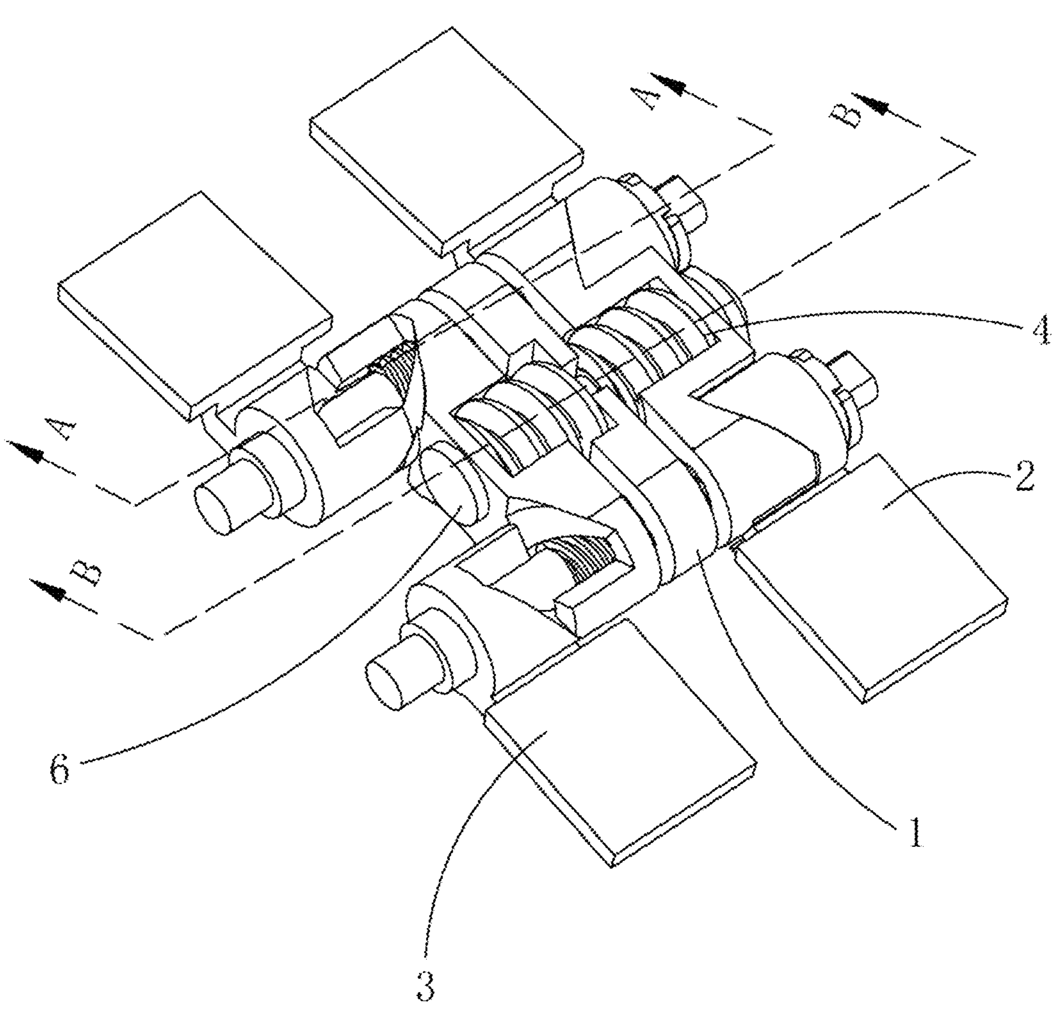
FIG. 1 is a schematic perspective view of a motorized hinge drive device according to some embodiments of the present disclosure.

The technical solutions in the embodiments of the present disclosure are described in detail clearly and completely hereinafter with reference to the accompanying drawings for the embodiments of the present disclosure. Apparently, the described embodiments are only a portion of embodiments of the present disclosure, but not all the embodiments of the present disclosure. Based on the embodiments of the present disclosure, all other embodiments derived by persons of ordinary skill in the art without any creative efforts shall fall within the protection scope of the present disclosure.

First Embodiment

With reference to FIG. 1 to FIG. 35, an embodiment of the present disclosure provides a motorized hinge drive device 100. The motorized hinge drive device 100 includes: a lead screw and nut assembly 1, a first flip drive assembly 2, a second flip drive assembly 3, a spring assembly 4, and a motor assembly 5.

The lead screw and nut assembly 1 includes two lead screws 11 arranged oppositely and a nut 12 simultaneously fitted on both of the lead screws 11. The lead screws 11 are threadedly transmissively connected to the nut 12. The lead screws 11 are transmissively connected to the motor assembly 5. The second flip drive assembly 3 and the first flip drive assembly 2 are positioned on opposite sides of the nut 12 or a same side of the nut 12. The second flip drive assembly 3 and the first flip drive assembly 2 are axially clamped at two ends of the lead screws 11. The two screws 11 are in a left-right symmetrical arrangement, the motor 51 drives the lead screws 11 to rotate, and the lead screws 11 are engaged with the nut 12 to define transmissive connections therebetween, such that the lead screws 11 rotate to drive the nut 12 to telescope along an axial direction of the lead screws 11. In the case that the lead screws 11 are in a top-bottom arrangement, the lead screws 11 rotate to drive the nut 12 to move upwards or downwards along the axial direction of the lead screws 11, such that the first flip drive assembly 2 or the second flip drive assembly 3 is driven to operate.

In this embodiment, the lead screw and nut assembly 1 functions to convert an output torque from the motor 51 to an axial push force, which acts on the first flip drive assembly 2 and the second flip drive assembly 3. In practice, the same function may be implemented using different mode of transmission of the nut 12. In the example illustrated in FIG. 32, one lead screw 11 and two nuts 12 are employed, and the entire assembly is in a centralized arrangement or layout. The motor 51 drives the lead screw 11 to rotate, such that the two nuts 12 are simultaneously driven to move upwards or downwards. In the case that a nut 12 moves upwards, a lower nut 12 pushes a slider a top slider of the second flip drive assembly 3 to move upwards. In the case that a nut 12 moves downwards, an upper nut 12 pushes a bottom slider of the first flip drive assembly 2 to move downwards. It should be noted that rotation of the nuts 12 needs to be restricted. Such restriction may be achieved by engagement with sliders of the first flip drive assembly 2 and the second flip drive assembly 3, or by configuring an axial sliding pair on a framework 201 of the hinge. In the example illustrated in FIG. 32, an axial securing shoulder 66 is arranged at each of two ends of the lead screw 11 to achieve axial clamping.

Figure 32:
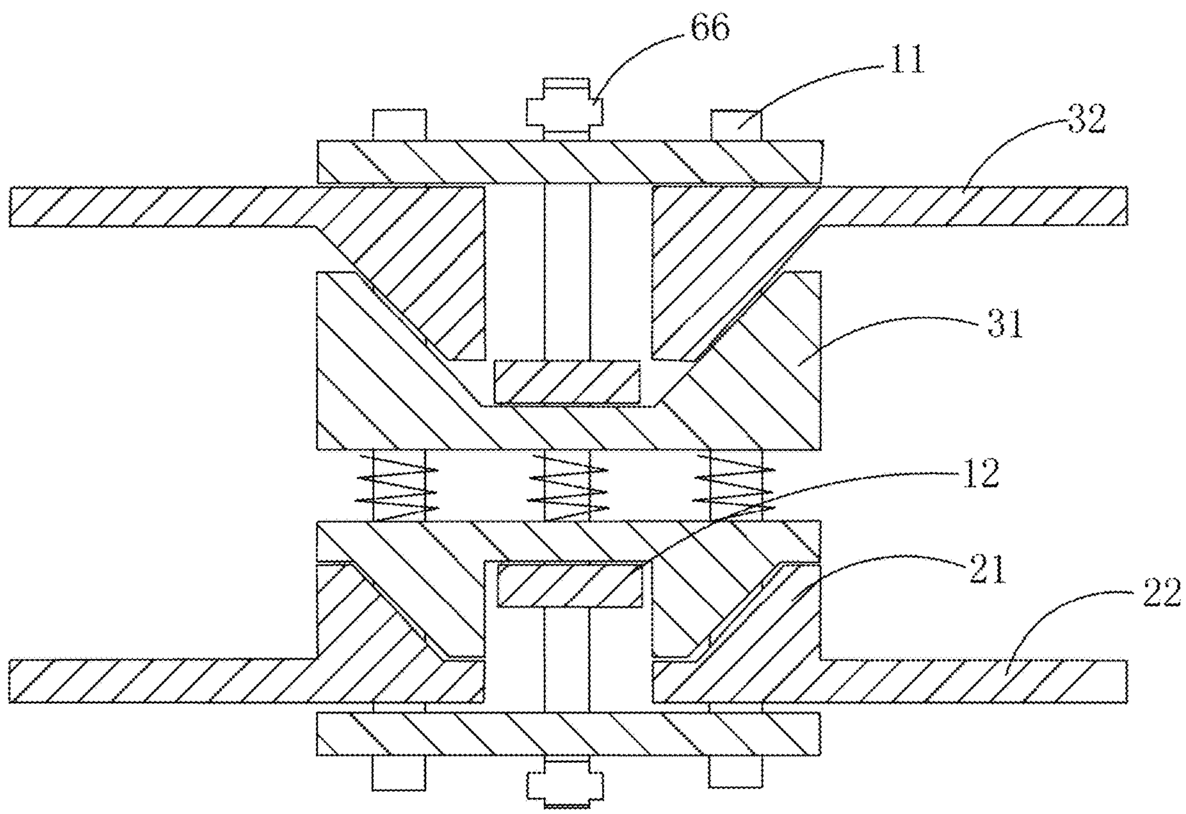
FIG. 32 is a first schematic view illustrating assembly of a lead screw and nut assembly according to some embodiments of the present disclosure.
Figure 33:
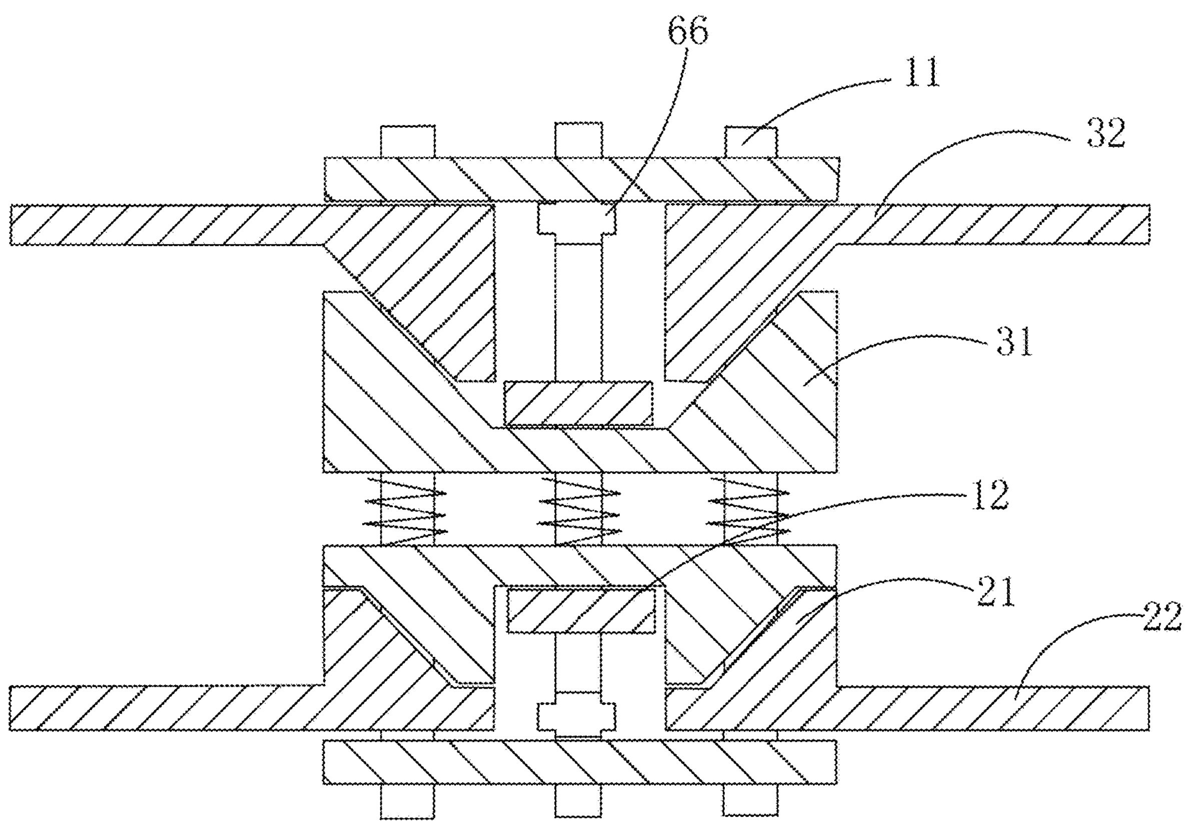
FIG. 33 is a second schematic view illustrating assembly of a lead screw and nut assembly according to some embodiments of the present disclosure.
Figure 34:
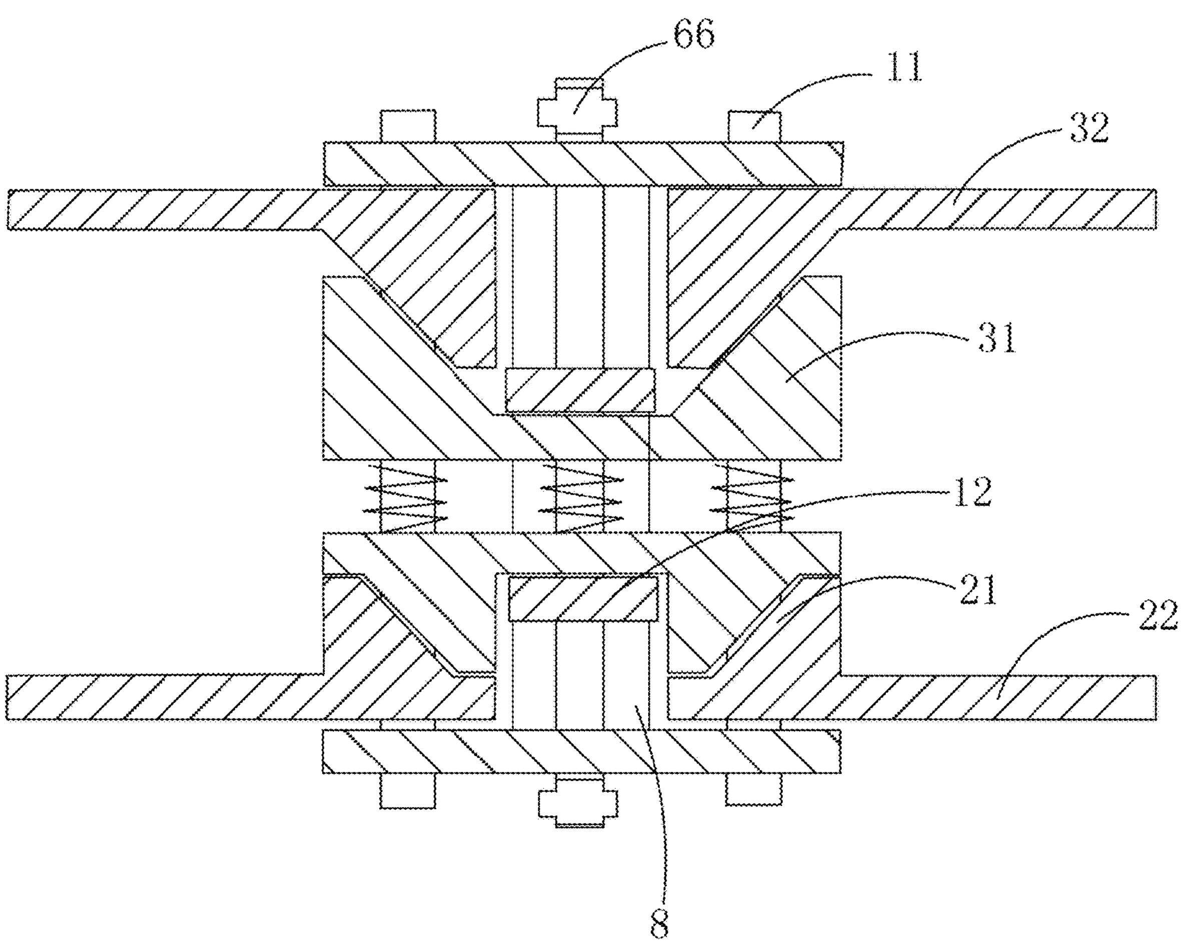
FIG. 34 is a third schematic view illustrating assembly of a lead screw and nut assembly according to some embodiments of the present disclosure.
Figure 35:
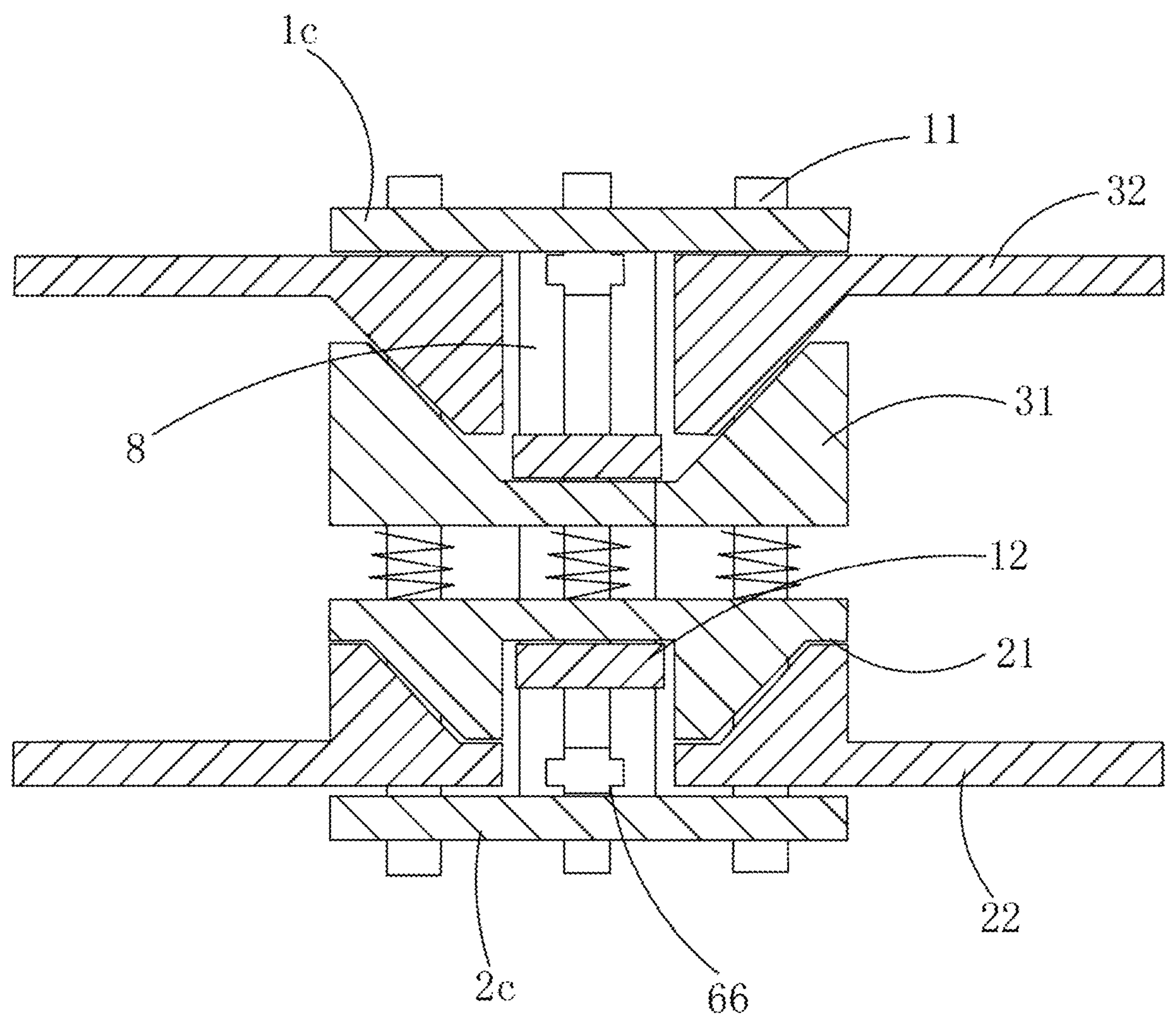
FIG. 35 is a fourth schematic view illustrating assembly of a lead screw and nut assembly according to some embodiments of the present disclosure.
Figure 36:
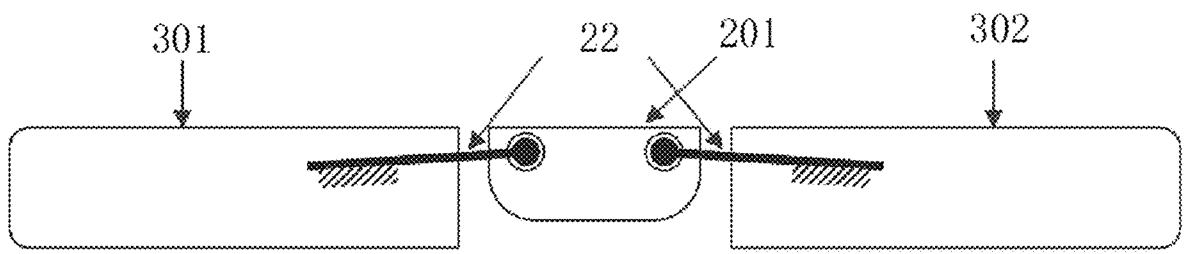
FIG. 36 is a first schematic structural view of a hinge device according to some embodiments of the present disclosure.
Figure 37:
FIG. 37 is a second schematic structural view of a hinge device according to some embodiments of the present disclosure.
Figure 37:
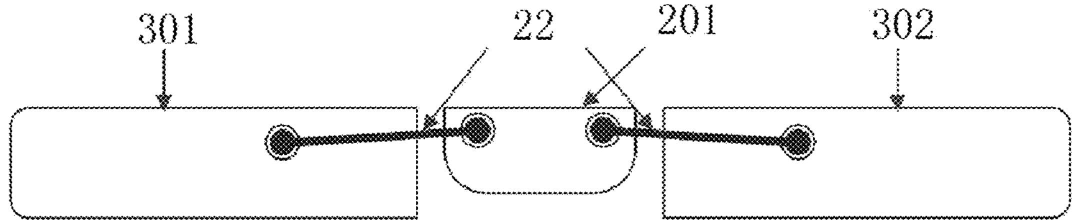
Figure 38:
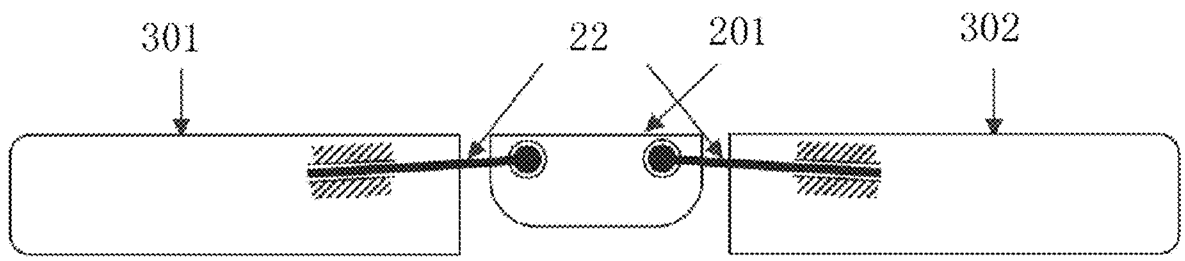
FIG. 38 is a third schematic structural view of a hinge device according to some embodiments of the present disclosure.
Figure 39:
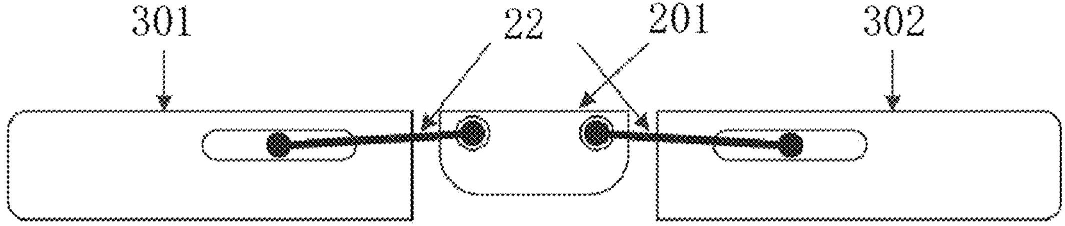
FIG. 39 is a fourth schematic structural view of a hinge device according to some embodiments of the present disclosure.

Based on the example as illustrated in FIG. 32, the securing shoulders 66 of the lead screw 11 may also be arranged below a first slider 21 or above a second slider 31. In this case, securing shoulders 66 also need to be arranged at two ends of a rotation shaft of left and right rotation arms to achieve axial clamping, as illustrated in the example in FIG. 33

In the meantime, the bottom slider of the first flip drive assembly 2 may also be securely connected to the top slider of the second flip drive assembly 3, and securing shoulders 66 are arranged at two ends of the lead screw 11 to achieve axial clamping. The securing shoulders 66 at the two ends of the lead screw 11 may be respectively arranged above the top slider and below the bottom slider, as illustrated in the example in FIG. 34. Optionally, the securing shoulders at the two ends of the lead screw may also be respectively arranged below the top slider 1*c* and above the bottom slider 2*c*, as illustrated in the example in FIG. 35.

Nevertheless, the upper and lower nuts 12 may also be securely connected to each other. After the upper and lower nuts 12 are securely connected, one of the upper and lower nuts 12 may not have threads.

Figure 43:
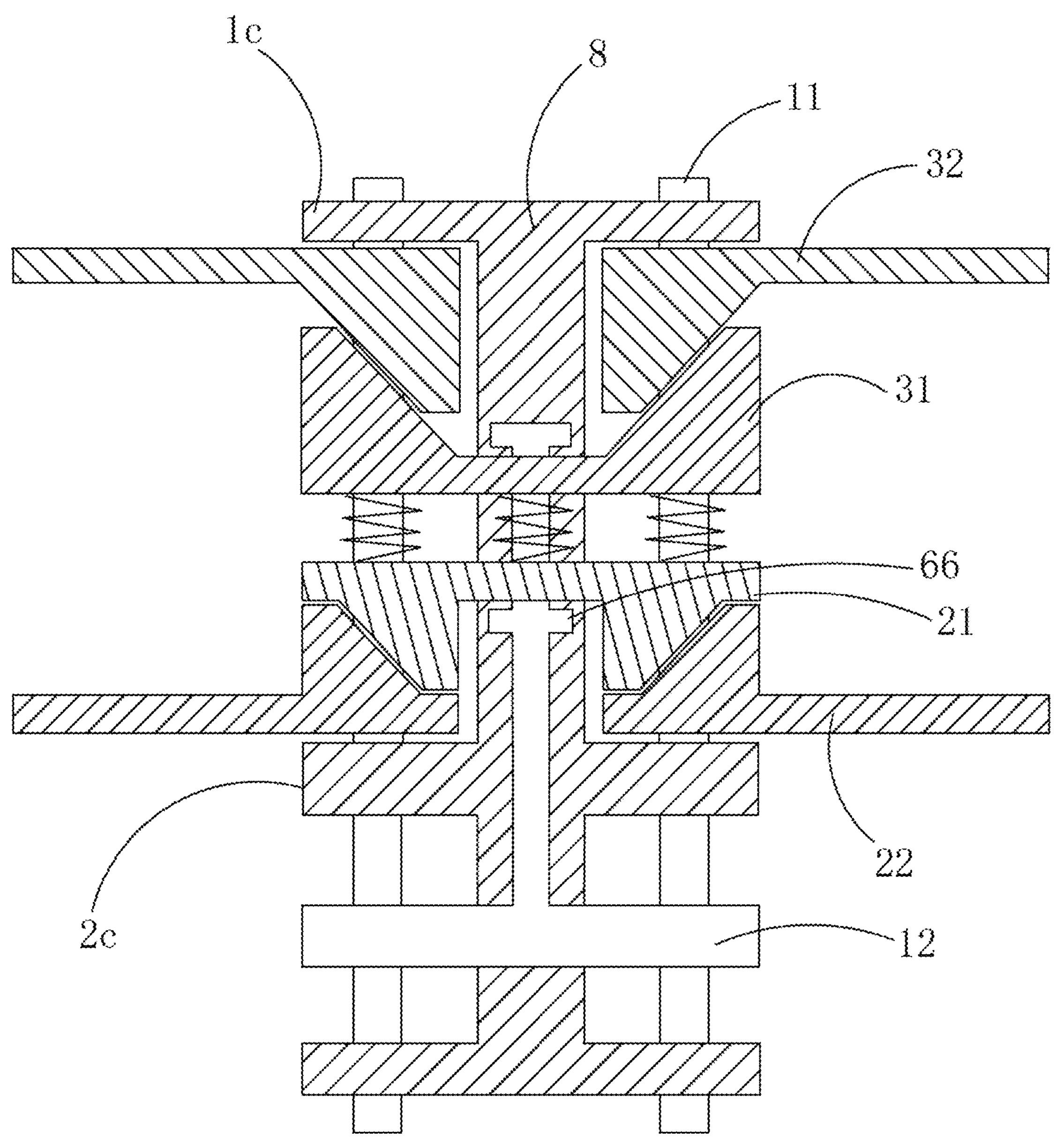
FIG. 43 is a fifth schematic view illustrating assembly of a lead screw and nut assembly according to some embodiments of the present disclosure.

The lead screw and nut assembly 1 may also be placed outside the first flip drive assembly 2 and the second flip drive assembly 3, such as positioned above the first flip drive assembly 2 or below the second flip drive assembly 3. In the example illustrated in FIG. 43, the lead screw nut assembly 1 is placed below the second flip drive assembly 3. The nut 12 is equipped with a securely connected pull rod 6. The pull rod 6 is provided with two securing shoulders 66, and serves to transfer a thrust from the nut 12 to the bottom slider 2*c* of the first flip drive assembly 2 and the top slider 1*c* of the second flip drive assembly 3.

In the case that the second flip drive assembly 3 and the first flip drive assembly 2 are positioned on the same side of the nut 12, the motorized hinge drive device 100 further includes a connection beam 8; wherein the first flip drive assembly 2, the second flip drive assembly 3, and the nut 12 that are successively arranged along the axial direction of the lead screws 11 are securely connected to the lead screws 11 via the connection beam 8. Specifically, the bottom slider of the first flip drive assembly 2, the top slider of the second flip drive assembly 3, and the lead screws 11 are securely connected via the intermediate connection beam 8.

In addition to the transmission of the nut 12, there are other ways to convert the torque output by the motor assembly 5 into a linear thrust, such as gear-rack transmission, tendon transmission, hydraulic transmission, pneumatic transmission, or the like. These transmission patterns may all be used in combination with the embodiments of the present disclosure.

The first flip drive assembly 2 is sleeved on the lead screw nut assembly 1. The first flip drive assembly 2 includes a first slider 21 that is sleeved on both lead screws 11 and two first rotation arms 22 that are oppositely arranged and each sleeved on one of the lead screws 11. The first slider 21 and the first rotation arm 22 are successively stacked along an axial direction of the lead screws 11 towards a direction away from the second flip drive assembly 3, and the first slider 21 is in slidable connection to the lead screws 11 along the axial direction of the lead screws 11. A first contact surface 23 is defined on a side, close to the first rotation arm 22, of the first slider 21, and a second contact surface 24 is defined on a side, close to the first slider 21 of the first rotation arm 22, the first contact surface 23 being in abutment against the second contact surface 24, and the first slider 21 presses against the first rotation arm 22 to cause the first rotation arm 22 to rotate along the lead screws 11 towards a first flipping direction. The first flipping direction is an unfolding direction or a folding direction.

The two first rotation arms 22 are respectively sleeved on two lead screws 11 and are left-right symmetrically arranged, and in this configuration, the first slider 21 is arranged on a side, close to the nut 12, of the first rotation arms 22. The first slider 21 and the first rotation arm 22 are provided with the first contact surface 23 and the second contact surface 24 that are engageable with each other, and the helix direction of a helical surface is defined as a direction in which the first slider 21 drives upwards the first rotation 22 to rotate towards the first flipping direction, such that the two first rotation arms 22 are driven to rotate towards the first flipping direction.

The second flip drive assembly 3 is sleeved on the lead screw and nut assembly 1, the second flip drive assembly 3 includes a second slider 31 simultaneously sleeved on the two lead screws 11 and two first rotation arms 32 that are oppositely arranged and are respectively sleeved on the two lead screws 11, and the second flip drive assembly 3 and the first flip drive assembly 2 are respectively positioned on two opposite sides of the nut 12. Facing another side away from the nut 12, the second slider 31 and the second rotation arm 32 are successively stacked along an axial direction of the lead screws 11 towards a direction away from the first flip drive assembly 2, and the second slider 31 is slidably connected to the lead screws 11 along the axial direction of the lead screws 11. A third helical surface 33 is defined on a side, close to the second rotation arm 32, of the second slider 31, and a fourth helical surface 34 is defined on a side, close to the second slider 31, of the second rotation arm 32, wherein the third helical surface 33 is in abutment against the fourth helical surface 34. The second slider 31 presses against the second rotation arm 32 to cause the second rotation arm 32 to rotate along the lead screws 11 towards a second flipping direction, wherein the second flipping direction is opposite to the first flipping direction. The two second rotation arms 32 are respectively sleeved on the two lead screws 11 and are left-right symmetrically arranged, and in this configuration, the second slider 31 is arranged on a side, close to the nut 12, of the second rotation arms 32. The second slider 31 and the second rotation arm 32 are provided with the third helical surface 33 and the fourth helical surface 34 that are engageable with each other, and the helix direction of the helical surfaces is defined as a direction in which the second slider 31 drives downwards the second rotations 32 to rotate towards the second flipping direction, such that the two second rotation arms 32 are driven to rotate towards the second flipping direction.

In this embodiment, for ease of illustration of the characteristics of the helical surface, an unfolded cross-sectional view of the helical surface is illustrated for description. Herein, the helical surface on a left helical pair of the first flip drive assembly 2 is taken as the example, and the characteristics of other helical surfaces are similar, including the helical surfaces on the right side of the first flip drive assembly 2 and the left and right helical surfaces of the second flip drive assembly 3. An intermediate cylindrical surface (with a radius equal to the average of an outer cylindrical surface and an inner hole radius) between the outer cylindrical surface and the inner hole of the left rotation arm of the first flip drive assembly 2 is taken as a cutting plane. The left rotation arm and the slider are cut to obtain a cylindrical slice, which is then unfolded to obtain the unfolded cross-sectional view illustrated in FIG. 8. In the unfolded cross-sectional view, the first contact surface 23 and the second contact surface 24 of the rotation arm correspondingly engage with the first contact surface 23 and the second contact surface 24 of the slider. The first contact surface 23 and the second contact surface 24 of the rotation arm/slider have identical shape characteristics.

Figure 2:
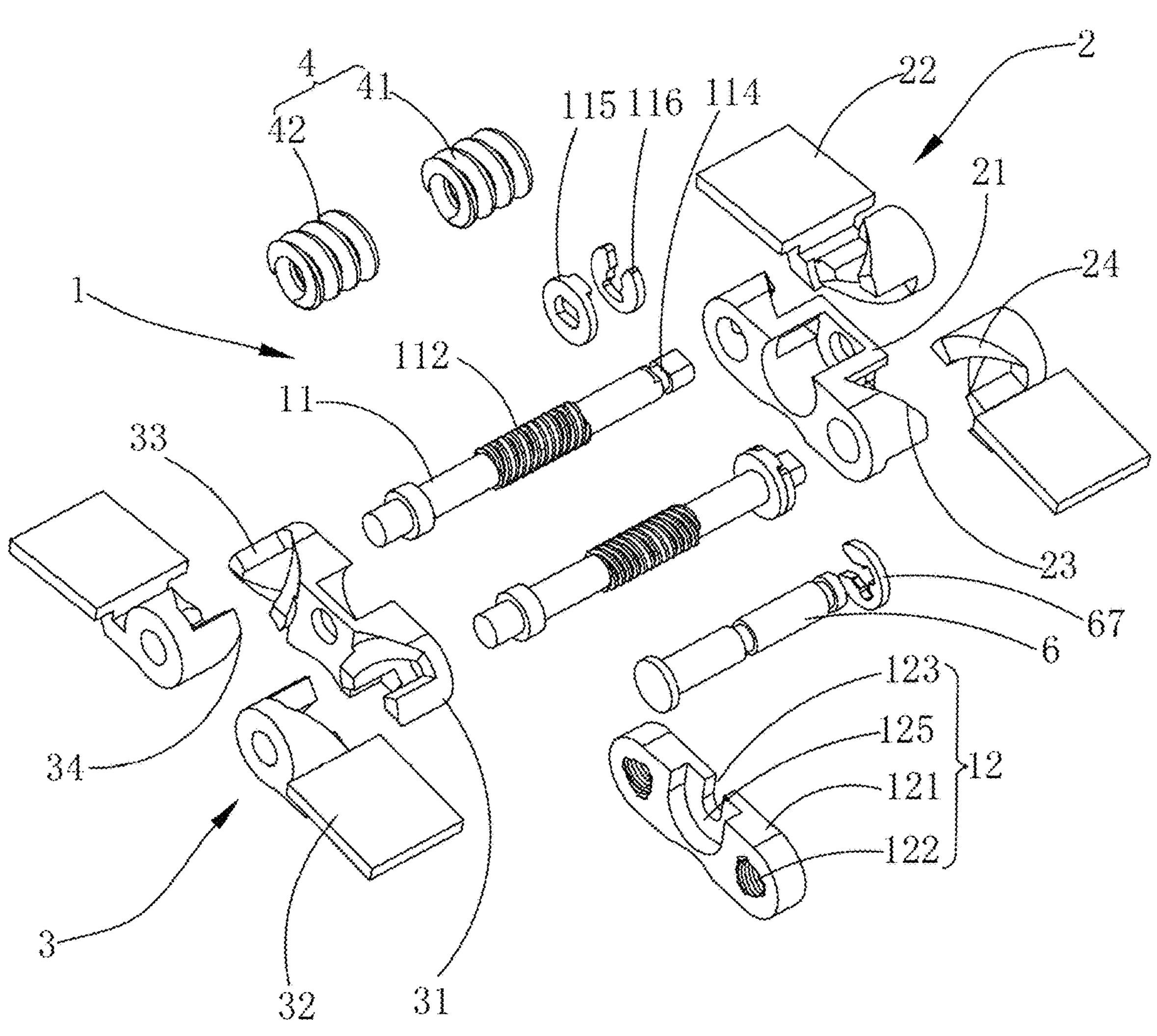
FIG. 2 is a schematic perspective exploded view of a motorized hinge drive device according to some embodiments of the present disclosure.
Figure 8:
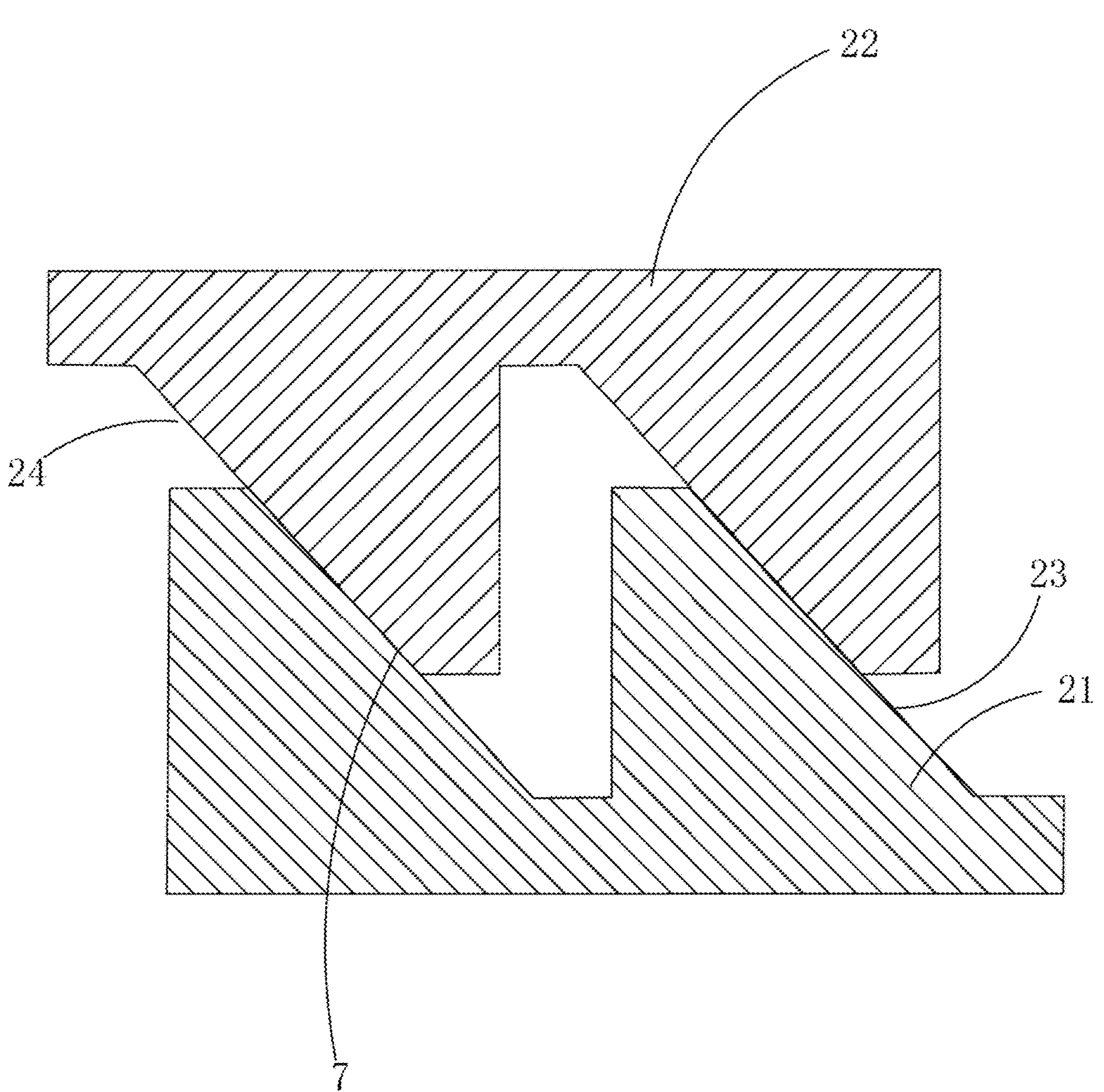
FIG. 8 is a first schematic view of a contact surface according to some embodiments of the present disclosure.
Figure 9:
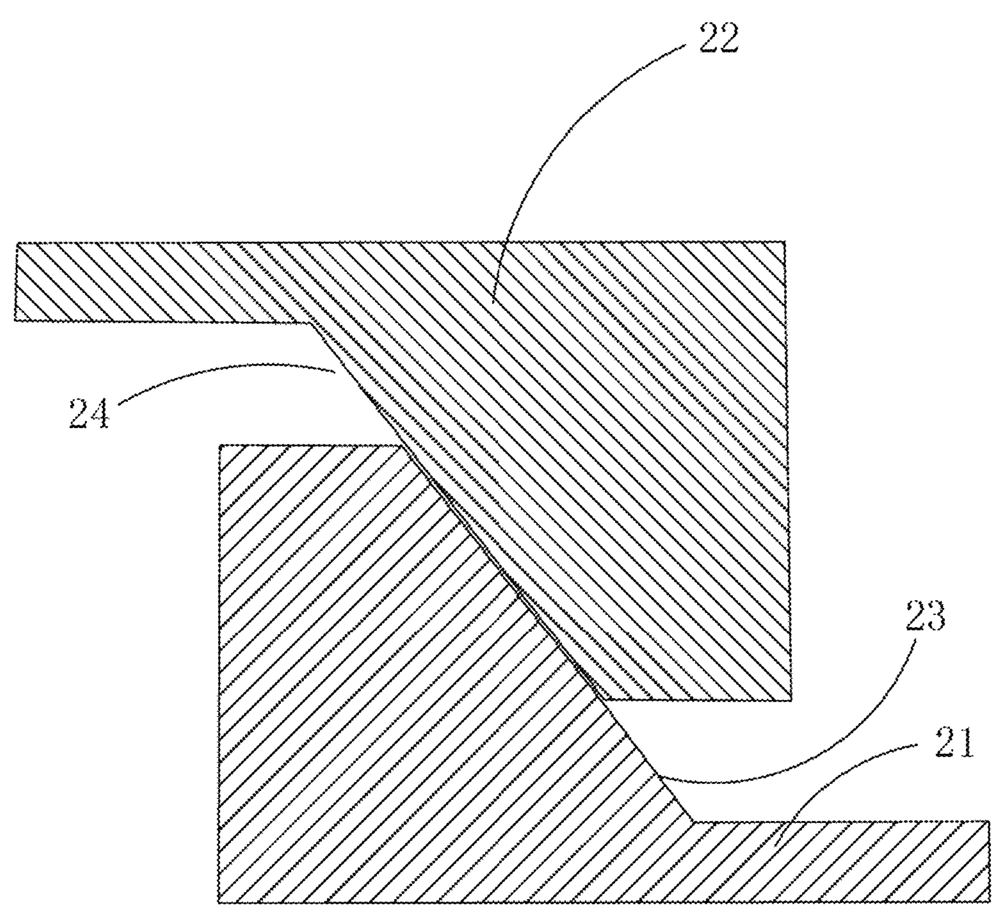
FIG. 9 is a second schematic view of a contact surface according to some embodiments of the present disclosure.
Figure 10:
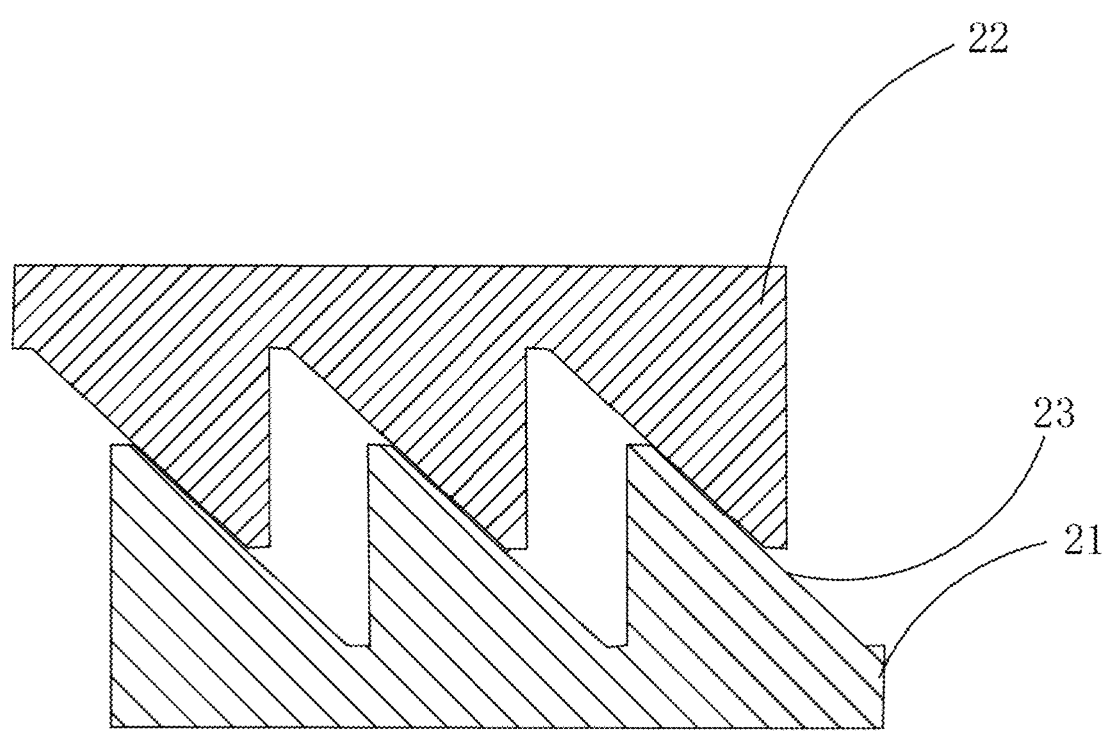
FIG. 10 is a third schematic view of a contact surface according to some embodiments of the present disclosure.

Specifically, in the example illustrated in FIG. 2, the left and right rotation arms each have two helical surfaces. Correspondingly, the left and right parts of the slider each have two engageable helical surfaces. The helical surfaces of the left and right rotation arms have opposite helix directions, forming a left-right mirror-symmetric configuration. Meanwhile, the helical surfaces on the same side (left or right) of the first flip drive assembly 2 and the second flip drive assembly 3 have the same helix direction. The unfolded cross-sectional view of the helical surface on the left side of the first flip drive assembly 2 is illustrated in FIG. 8. Protruding teeth 7 where the first contact surface 23 and the second contact surface 24 are located are referred to as a first tooth and a second tooth, respectively.

The number of helical surfaces on the left/right rotation arms of the first flip drive assembly 2 or the second flip drive assembly 3 may vary depending on the size of the lead angle of the helical surface. In the case that the lead angle of the helical surface is relatively large, the protruding teeth 7 may be taller, which may result in significant deformation during operation. For less deformation of the protruding teeth 7, the number of teeth 7 may be decreased, and the remaining teeth 7 may be widened. For example, only one protruding tooth 7 is used, as illustrated in the example in FIG. 9. In this case, the rotation arm and the slider have only one set of engageable helical surfaces.

In the case that the lead angle of the helical surface is relatively small, the risk of deformation of the protruding teeth 7 during operation is low. In this case, the tooth width may be reduced, and the number of teeth (helical surfaces) may be increased. This helps to improve the balanced distribution of interaction forces between the rotation arm and the slider, reducing stress and wear. For example, the number of helical surfaces may be increased to three, as illustrated in the example in FIG. 10.

In the example illustrated in FIG. 2, the helical surfaces appear as straight lines in the unfolded cross-sectional view, and their lead angle is constant. This is conducive to achieving a uniform motorized opening and closing speed as well as a stable driving torque.

Figure 11:
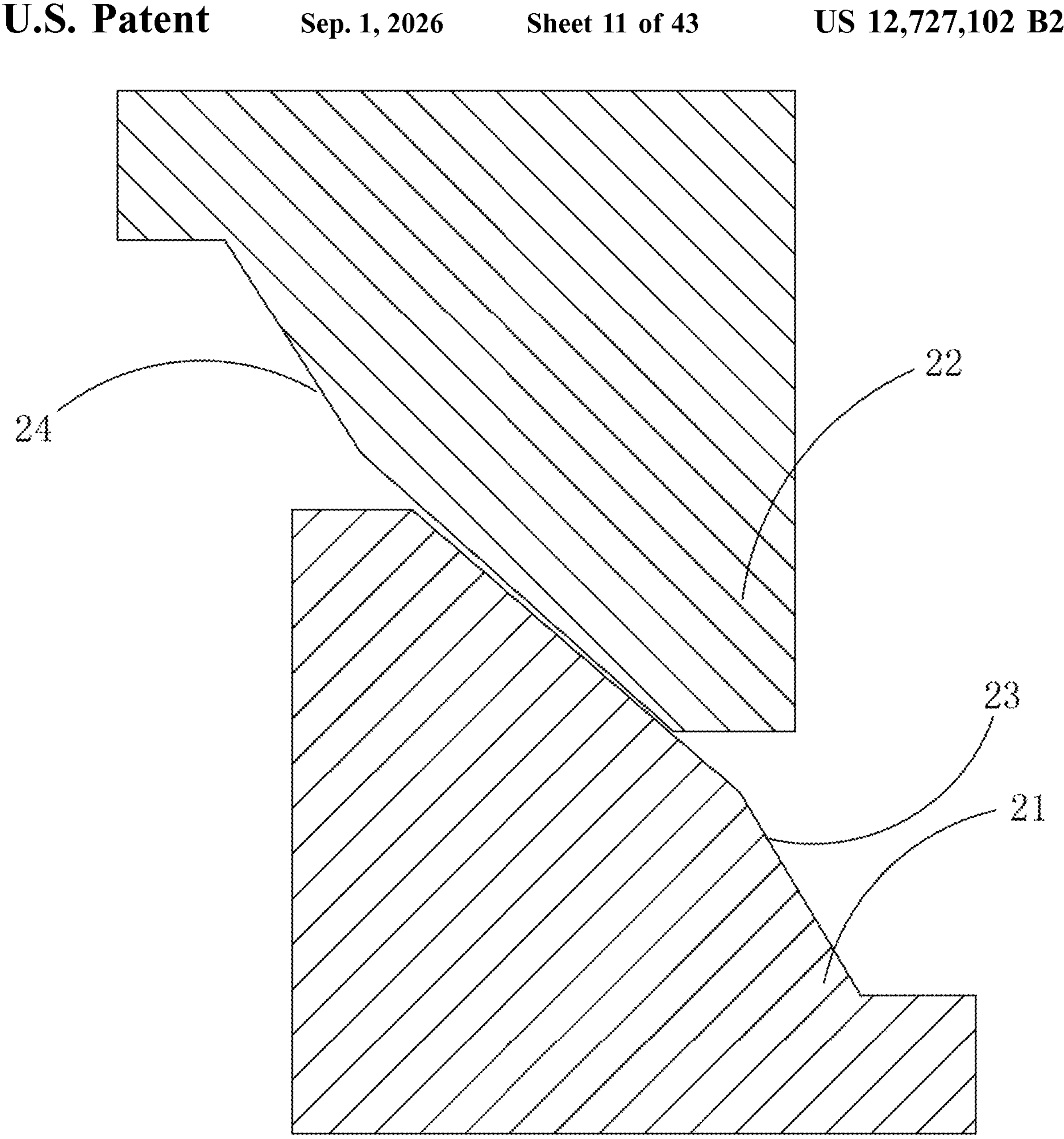
FIG. 11 is a fourth schematic view of a contact surface according to some embodiments of the present disclosure.
Figure 12:
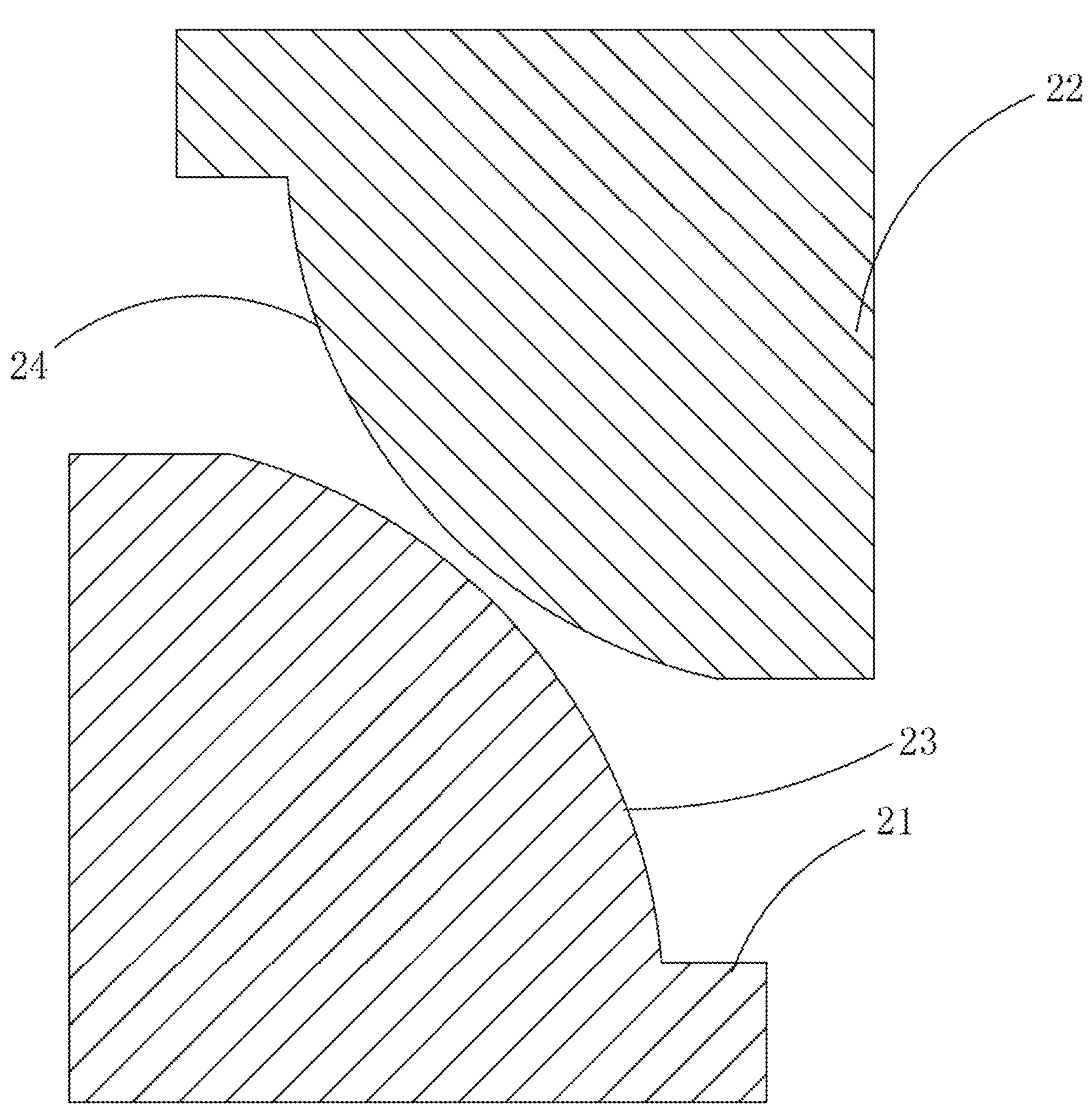
FIG. 12 is a fifth schematic view of a contact surface according to some embodiments of the present disclosure.

In practice, the load on foldable electronic devices during the unfolding/folding process may be uneven, and the required driving torque may vary. In some scenarios, an uneven opening and closing speed may also be required. In such cases, helical surfaces with non-uniform lead angles may be used. For example, segmented constant lead angle helical surfaces, as illustrated in FIG. 11, or helical surfaces with continuously varying lead angles, as illustrated in FIG. 12, may be used. Specifically, two or more segments of segmented constant lead angle helical surfaces may be employed. The helical surface may also employ a combination configuration in terms of different types, with some sections having constant lead angles and others having continuously varying lead angles.

In the example illustrated in FIG. 2, the helical surfaces on the same side of the first flip drive assembly 2 and the second flip drive assembly 3 share the same characteristics.

In practice, the load during the unfolding and folding of foldable electronic devices may differ, or the speed requirements for unfolding and folding may vary. In such cases, the helical surfaces on the same side of the first flip drive assembly 2 and the second flip drive assembly 3 may be designed with different characteristics.

Figure 13:
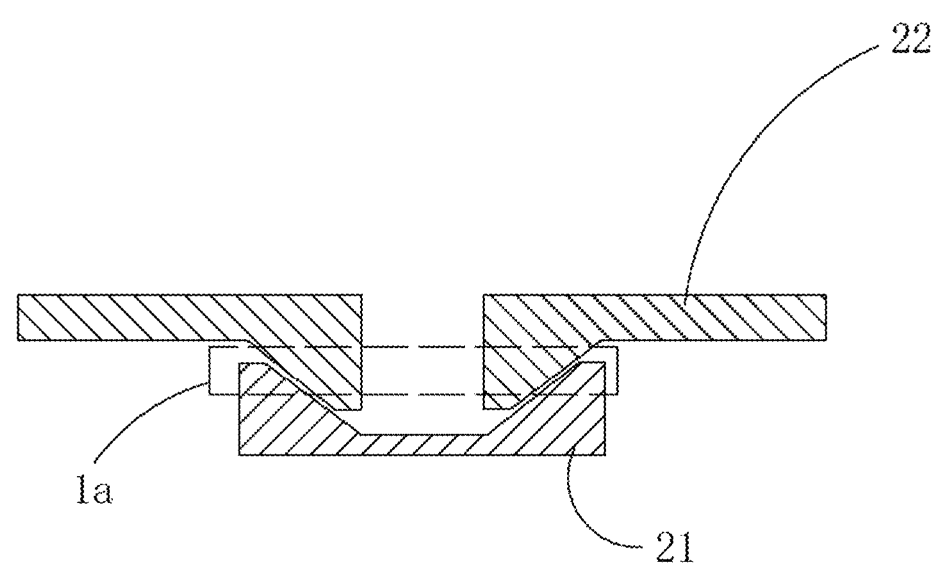
FIG. 13 is a sixth schematic view of a contact surface according to some embodiments of the present disclosure.

In the case that the helical pair of the first flip drive assembly 2 or the second flip drive assembly 3 requires a larger lead angle, while maximizing the number of teeth 7 and minimizing the height thereof, a plurality of helical transmission pairs may be axially stacked. The first flip drive assembly 2 and the second flip drive assembly 3 each have only one slider and one pair of rotation arms, such that one helical transmission pair is formed on each side, as illustrated in FIG. 13. Specifically, the first slider 21 and the two first rotation arms 22 are defined as a first flipping unit 40, while the second slider 31 and the two second rotation arms 32 are defined as a second flipping unit (not illustrated in the drawings). The first flip drive assembly 2 includes at least one first flipping unit 40, and the second flip drive assembly 3 includes at least one second flipping unit. The contact surfaces between the first slider 21 and the two first rotation arms 22 are helical surfaces. Similarly, the contact surfaces between the second slider 31 and the two second rotation arms 32 are also helical surfaces.

Figure 14:
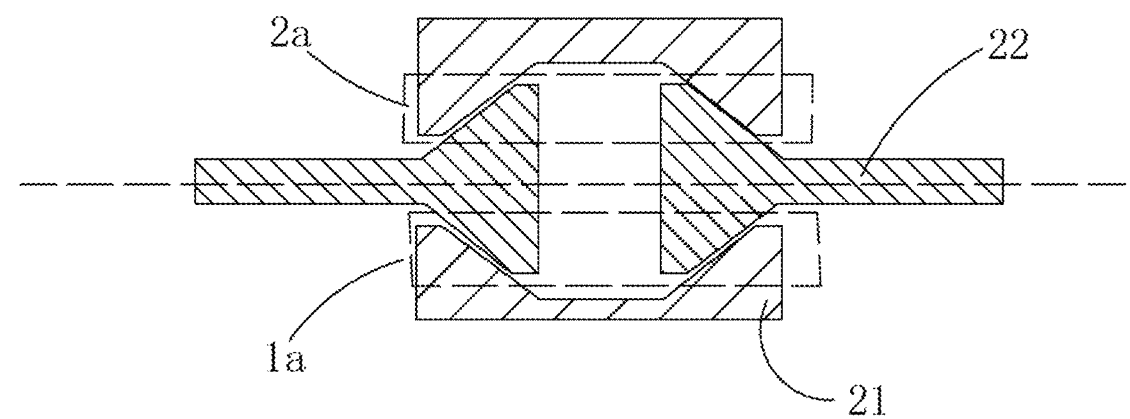
FIG. 14 is a seventh schematic view of a contact surface according to some embodiments of the present disclosure.

In this embodiment, the example illustrated in FIG. 14 is based on the example illustrated in FIG. 2. Two first flipping units 40 and two second flipping units are provided. The two first flipping units 40 are arranged in a mirror-image configuration along a direction perpendicular to the axial direction of the lead screws 11; and similarly, the two second flipping units are arranged in a mirror-image configuration along a direction perpendicular to the axial direction of the lead screws 11. Contact surfaces between the first sliders 21 of the two first flipping units 40 and the two first rotation arms 22 are helical surfaces, and contact surfaces between the second sliders 31 of the second slipping units and the two second rotation arms 32 are helical surfaces.

Specifically, a slider is further stacked on the first rotation arm 22, and a helical engagement surface is arranged on a side, in contact with the first rotation arm 22, of the slider to form a second helical pair 2*a*. With respect to the first flip drive assembly 2, the helix direction of the first contact surface 23 is defined as a direction along which the slider presses against the rotation arm to subject the rotation arm to a torque in the first flipping direction. Similarly, with respect to the second flip drive assembly 3, the helix direction of the first contact surface 23 is defined as a direction along which the slider presses the rotation arm to subject the rotation arm to a torque in the second flipping direction. In this case, the helical transmission assembly has two sets of stacked helical pairs, and thus an equivalent lead is increased. It should be noted that helical surface characteristics of the first helical pair 1*a* may be identical to or different from those of the helical surface on the same side of the second helical pair 2*a*.

Where the equivalent lead of the helical transmission assembly needs to be further increased, as illustrated in the example in FIG. 14, a plurality of sliders and rotation arms may be alternately stacked on the basis of the example in FIG. 2. Helical pairs are configured on the contact surfaces between the sliders and the rotation arms, such that a plurality of sets of helical pairs stacked are formed. With respect to the first flip drive assembly 2, the helix direction of the helical surface is defined as a direction along which the slider presses against the rotation arm to subject the rotation arm to a torque in the first flipping direction. Similarly, with respect to the second flip drive assembly 3, the helix direction of the helical surface is defined as a direction along which the slider presses against the rotation arm to subject the rotation arm to a torque in the second flipping direction.

In this embodiment, at least two first flipping units 40 and at least two second flipping units are provided. Two adjacent first flipping units 40 are arranged in a mirror-image configuration along a direction perpendicular to the axial direction of the lead screws 11. Two adjacent second flipping units are arranged in a mirror-image configuration along a direction perpendicular to the axial direction of the lead screws 11. Contact surfaces between the first sliders 21 of at least two adjacent first flipping units 40 and the two first rotation arms 22 are helical surfaces, and contact surfaces between the second sliders 31 of at least two adjacent second slipping units and the two second rotation arms 32 are helical surfaces. In some embodiments, adjacent first sliders 21 between two adjacent first flipping units 40 are integrally formed, and adjacent second sliders 31 between two adjacent second flipping units are integrally formed. In some embodiments, adjacent first rotation arms 22 between two adjacent first flipping units 40 are integrally formed, and adjacent rotation arms 32 between two adjacent second flipping units are integrally formed. The integral structure has a compact size.

Figure 3:
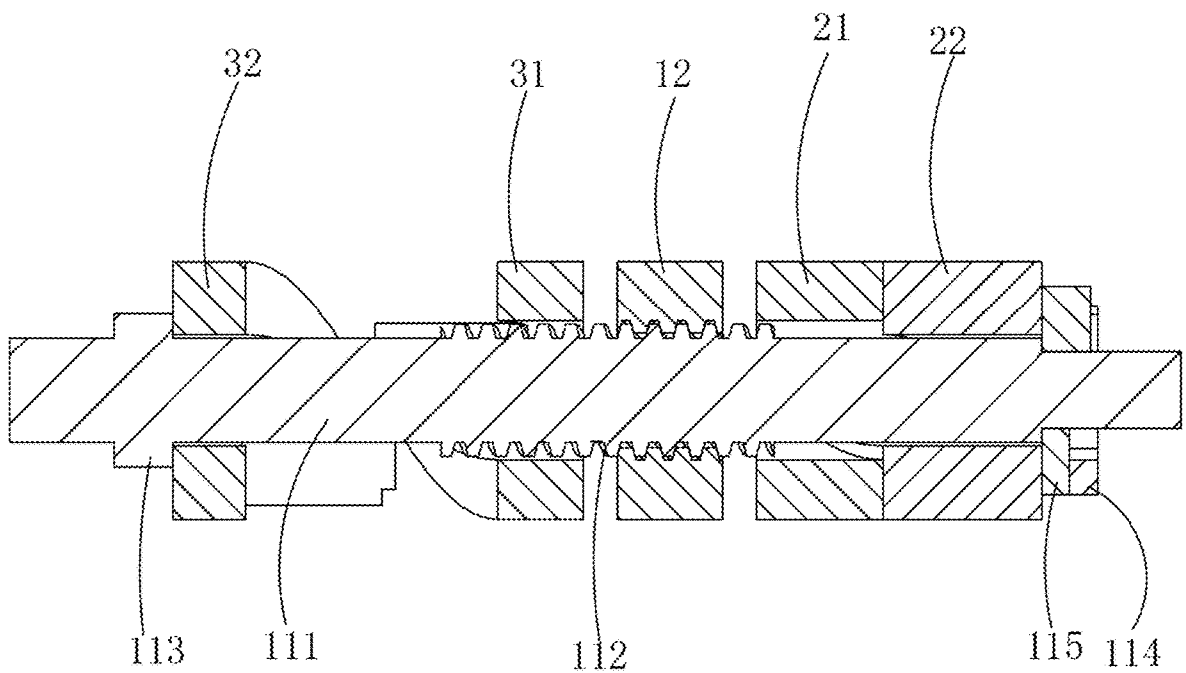
FIG. 3 is an A-A sectional view of FIG. 1.
Figure 4:
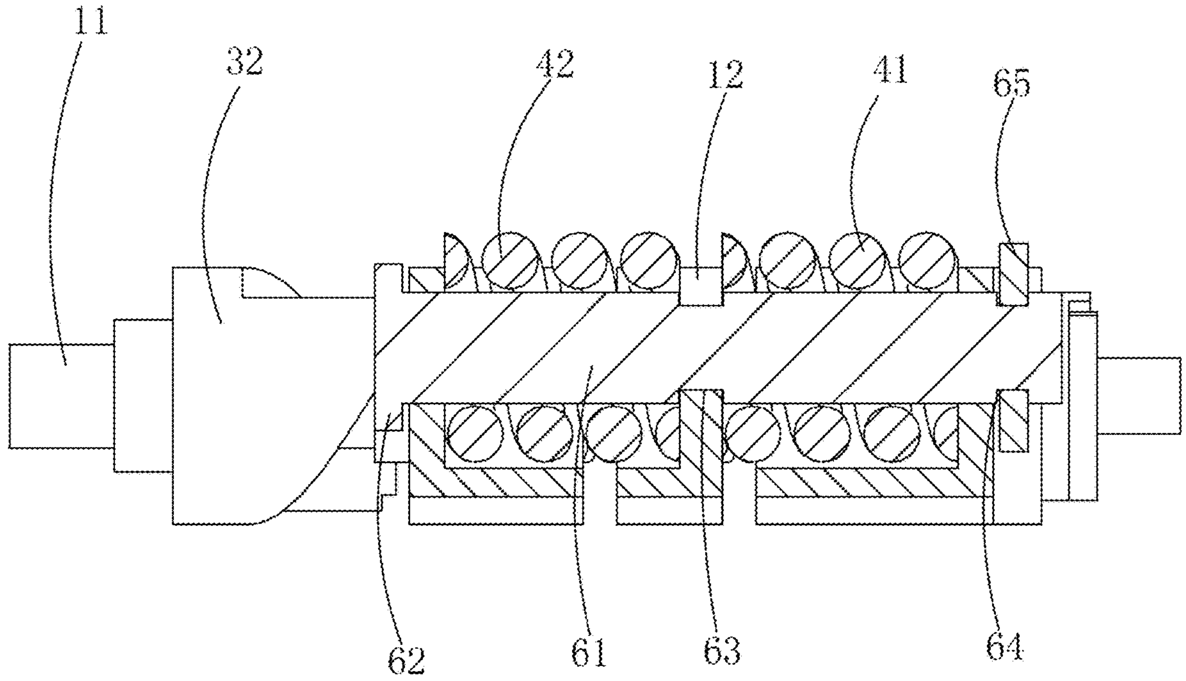
FIG. 4 is a B-B sectional view of FIG. 1.
Figure 5:
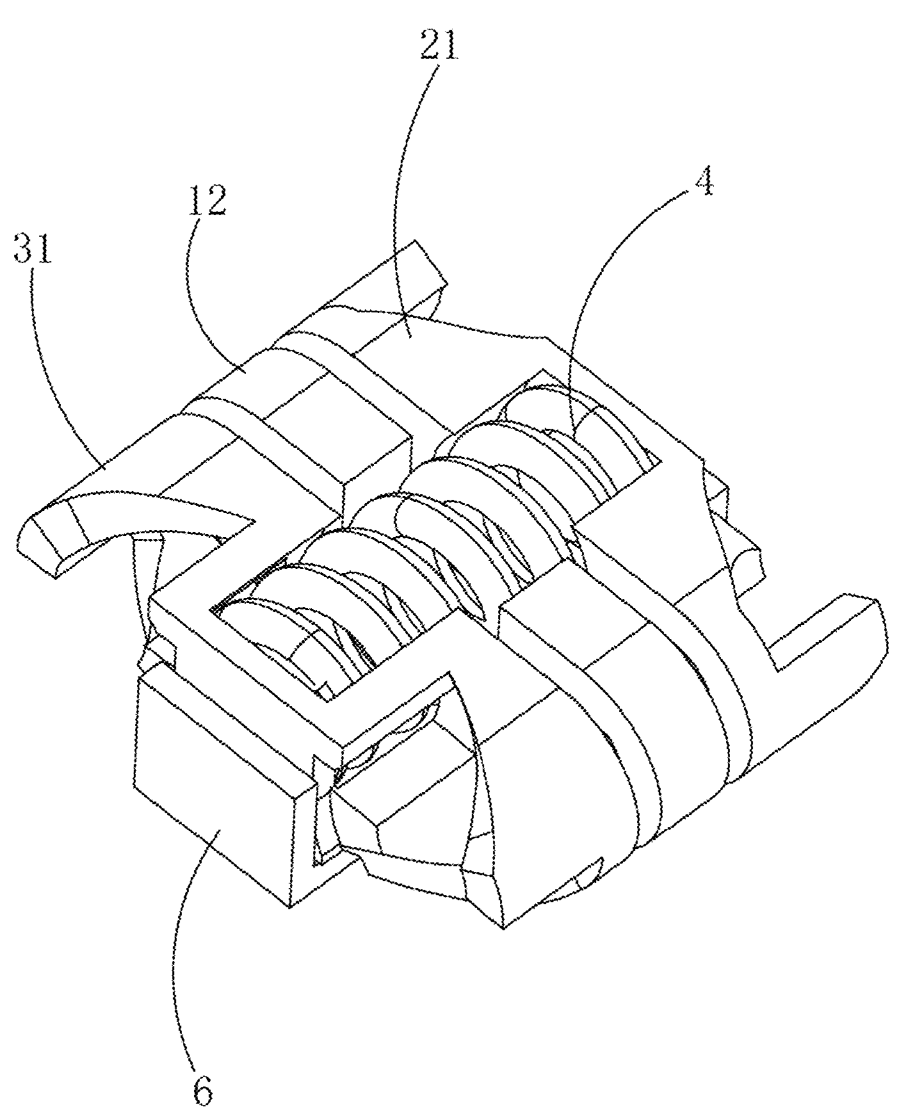
FIG. 5 is a schematic view of a pull rod according to some embodiments of the present disclosure.
Figure 6:
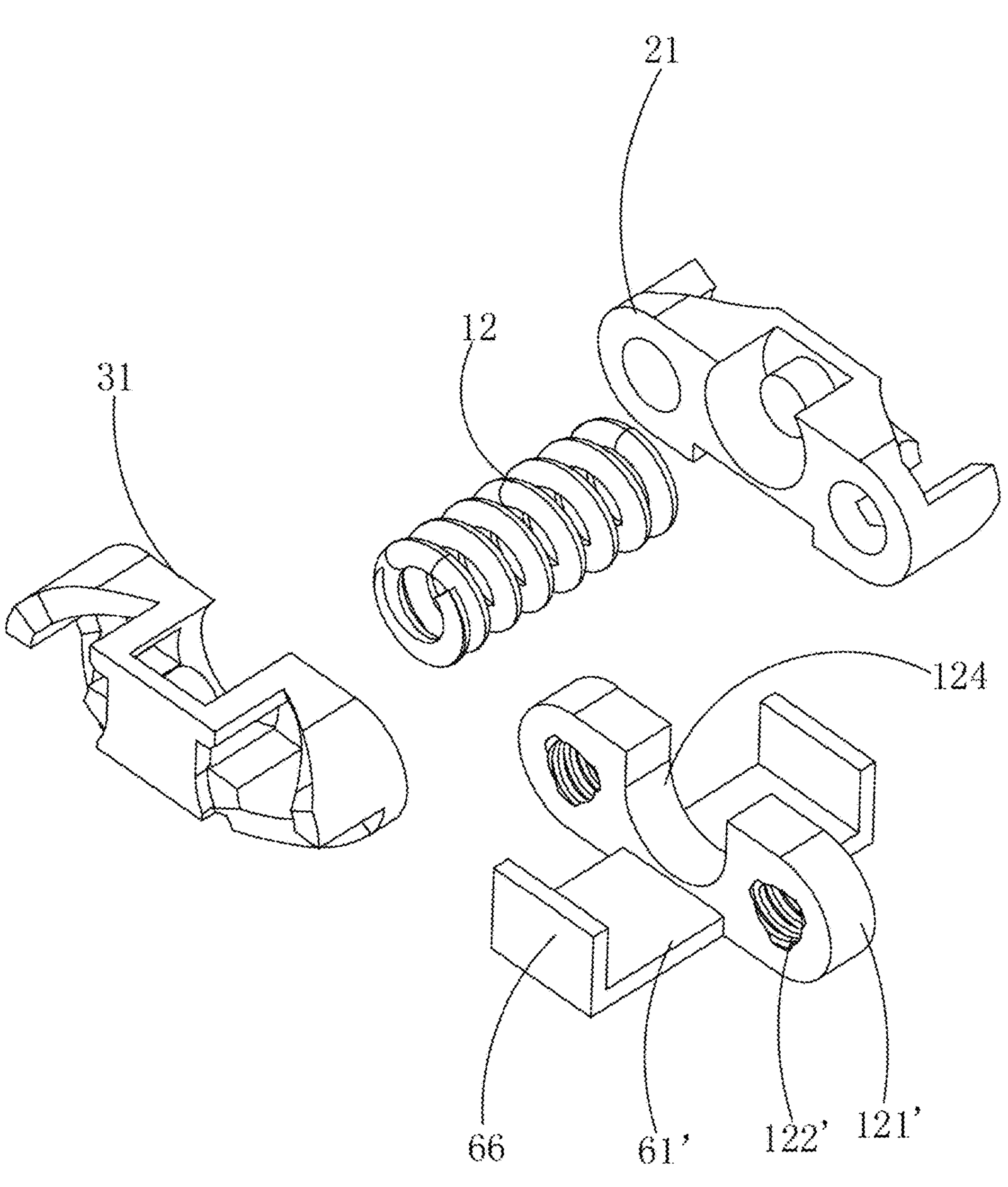
FIG. 6 is an exploded view of FIG. 5.
Figure 7:
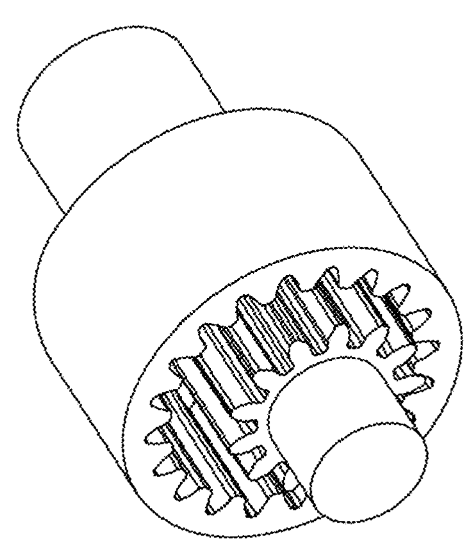
FIG. 7 is a schematic structural view of a transmission assembly according to some embodiments of the present disclosure.
Figure 15:
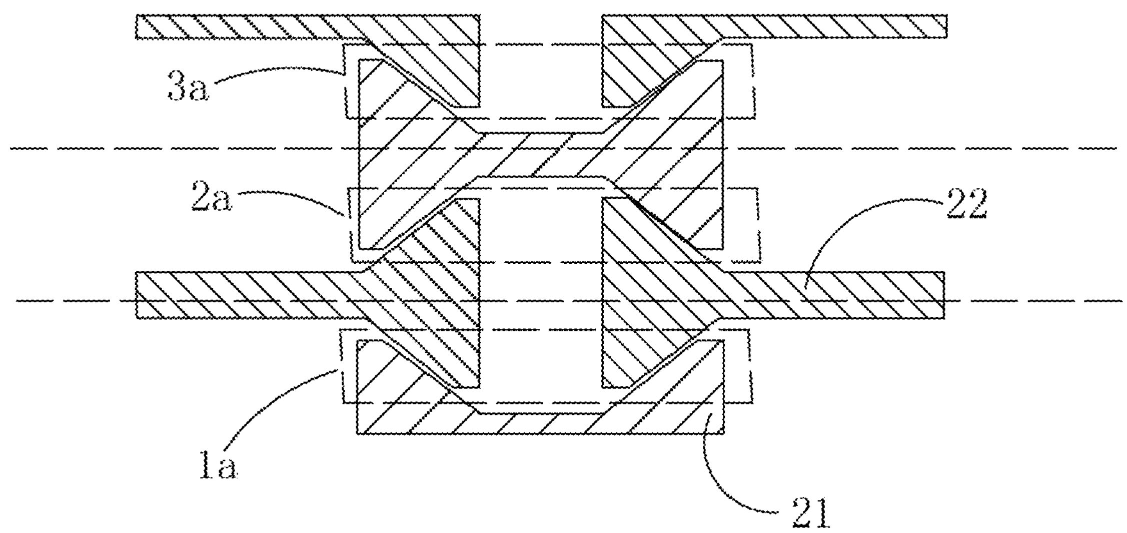
FIG. 15 is an eighth schematic view of a contact surface according to some embodiments of the present disclosure.

Specifically, in the example illustrated in FIG. 15, an additional slider and a pair of rotation arms are alternately stacked on the basis of the example illustrated in FIG. 3. In this case, the helical transmission assembly has three sets of stacked helical pairs, for example, the first helical pair 1*a*, the second helical pair 2*a*, and the third helical pair 3*a*, such that the equivalent lead is further increased. It is to be noted that characteristics of the helical surfaces each set of helical pairs on the same side may be the same or different.

Optionally, axially stacking a plurality of sets of helical pairs is applicable to both the first flip drive assembly 2 and the second flip drive assembly 3, with similar principles. It should be noted that a bottom-most member of the first flip drive assembly 2 is the slider, and a top-most member of the second flip drive assembly 3 is the slider. The number of stacked helical pairs in the first flip drive assembly 2 may be the same as or different from the number of stacked helical pairs in the second flip drive assembly 3.

Figure 16:
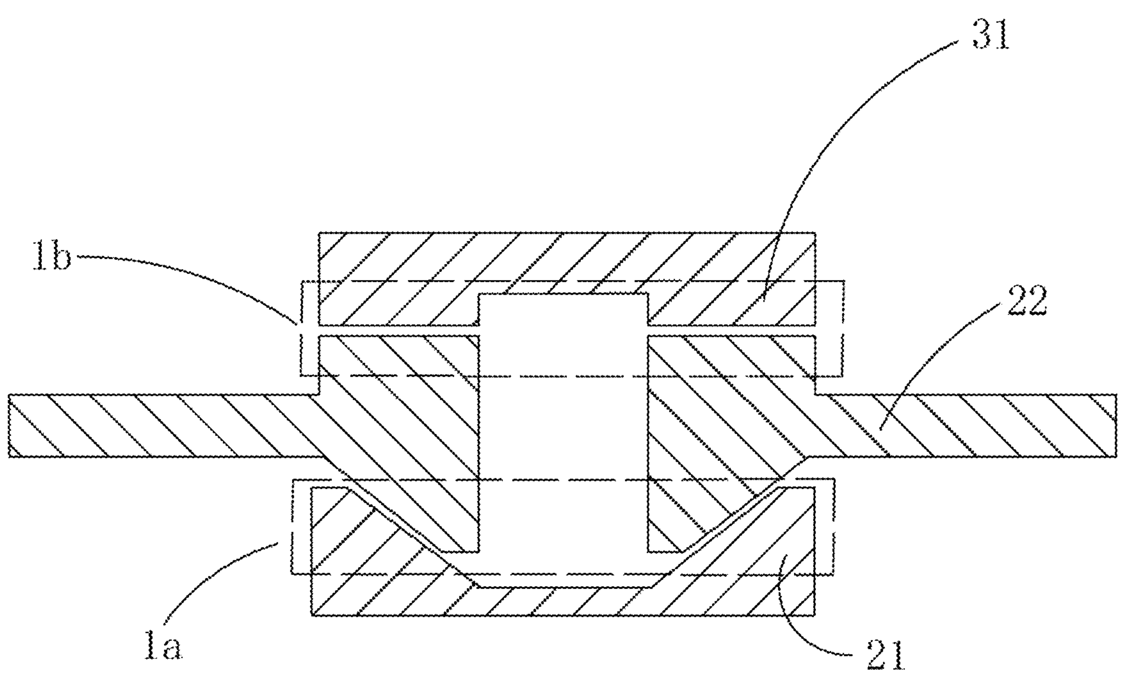
FIG. 16 is a ninth schematic view of a contact surface according to some embodiments of the present disclosure.

Specifically, another effect of axially stacking a plurality of sets of helical pairs is to increase the frictional resistance between the arms and the sliders, which helps to improve the hovering stability, but also increases the axial dimensions. Where increase of the hovering stability is prioritized and there is no need to increase the equivalent lead, one or more of the helical pairs in the above-mentioned stacked solution may be replaced with planar friction pairs. However, at least one set of helical pairs needs to be retained, which can effectively reduce the axial dimensions. An example illustrated in FIG. 16 is based on the example illustrated in FIG. 14, where the second helical pair 2*a* is replaced with a first planar friction pair 1*b*. The assembly includes one set of helical pairs and one set of the first planar friction pairs 1*b*.

Figure 17:
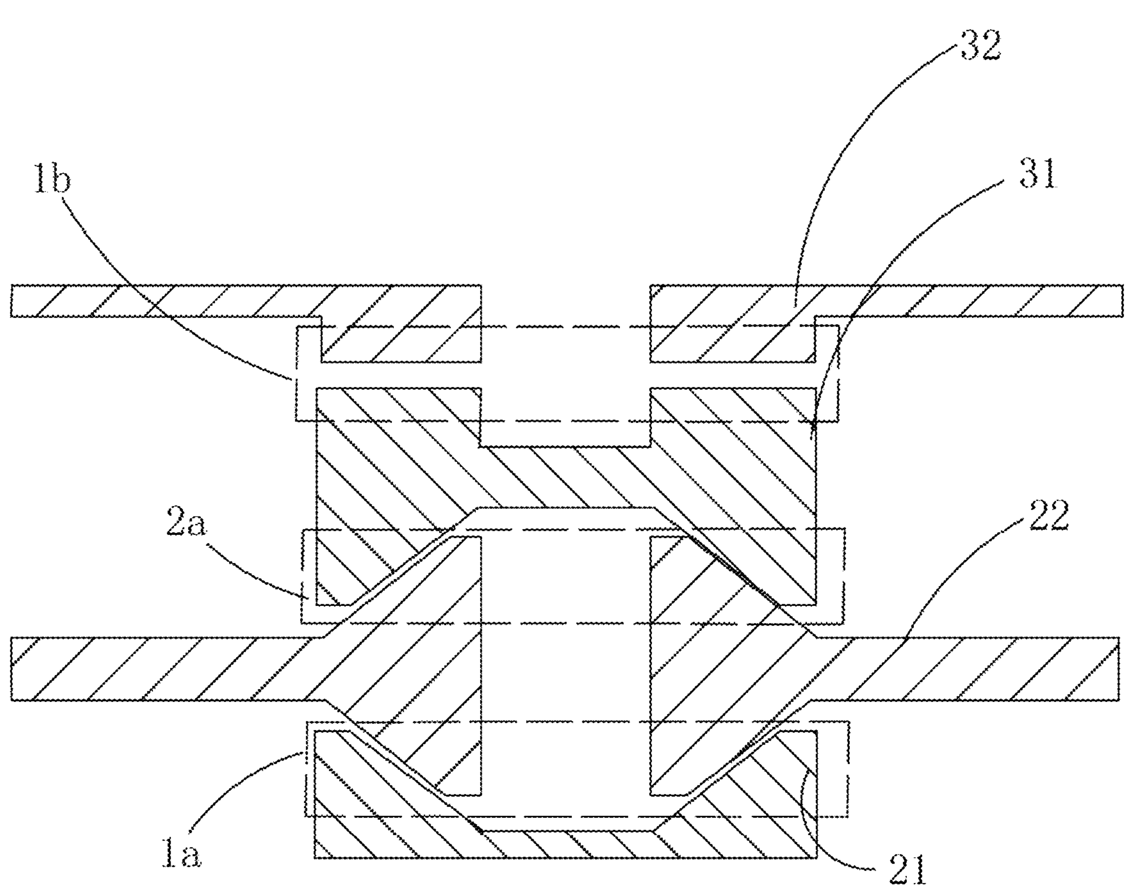
FIG. 17 is a tenth schematic view of a contact surface according to some embodiments of the present disclosure.

The example illustrated in FIG. 17 is based on the example illustrated in FIG. 14, where the third helical pair 3*a* is replaced with a first planar friction pair 1*b*. The assembly includes two sets of helical pairs and one set of the first planar friction pairs 1*b*.

Figure 18:
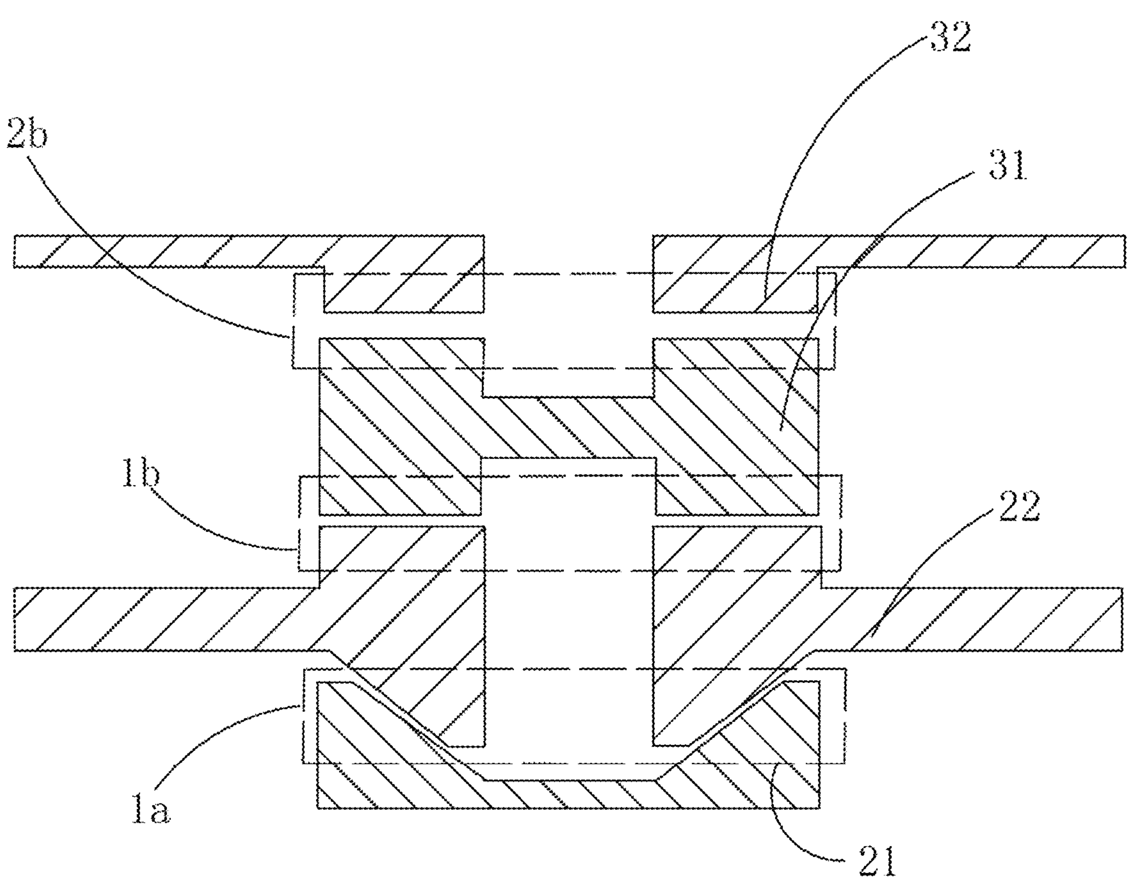
FIG. 18 is an eleventh schematic view of a contact surface according to some embodiments of the present disclosure.

An example illustrated in FIG. 18 is based on the example illustrated in FIG. 14, where the second helical pair 2*a* and the third helical pair 3*a* are replaced with the first planar friction pair 1*b* and the second planar friction pair 2*b*. The assembly includes one set of helical pairs and two sets of planar friction pairs.

Figure 19:
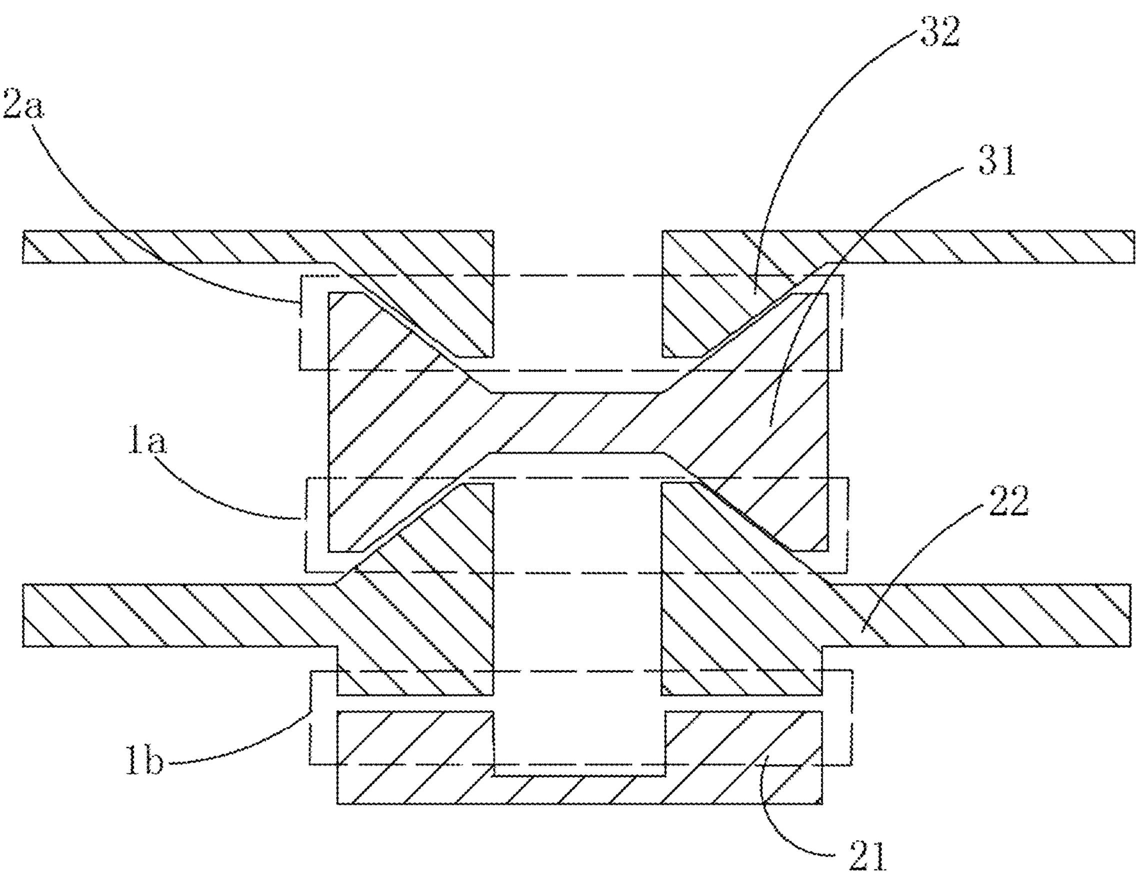
FIG. 19 is a twelfth schematic view of a contact surface according to some embodiments of the present disclosure.

Specifically, in the above embodiments, which set or sets are selected to be replaced with planar friction pairs may be determined as needed, and the transmission effect still remains the same. For example, the example illustrated in FIG. 19 is based on the example illustrated in FIG. 14, where the first helical pair 1*a* is replaced with the first planar friction pair 1*b*. The assembly includes two sets of helical pairs and one set of planar friction pairs, and the transmission effects of the assembly are the same as those in the example illustrated in FIG. 17.

Figure 20:
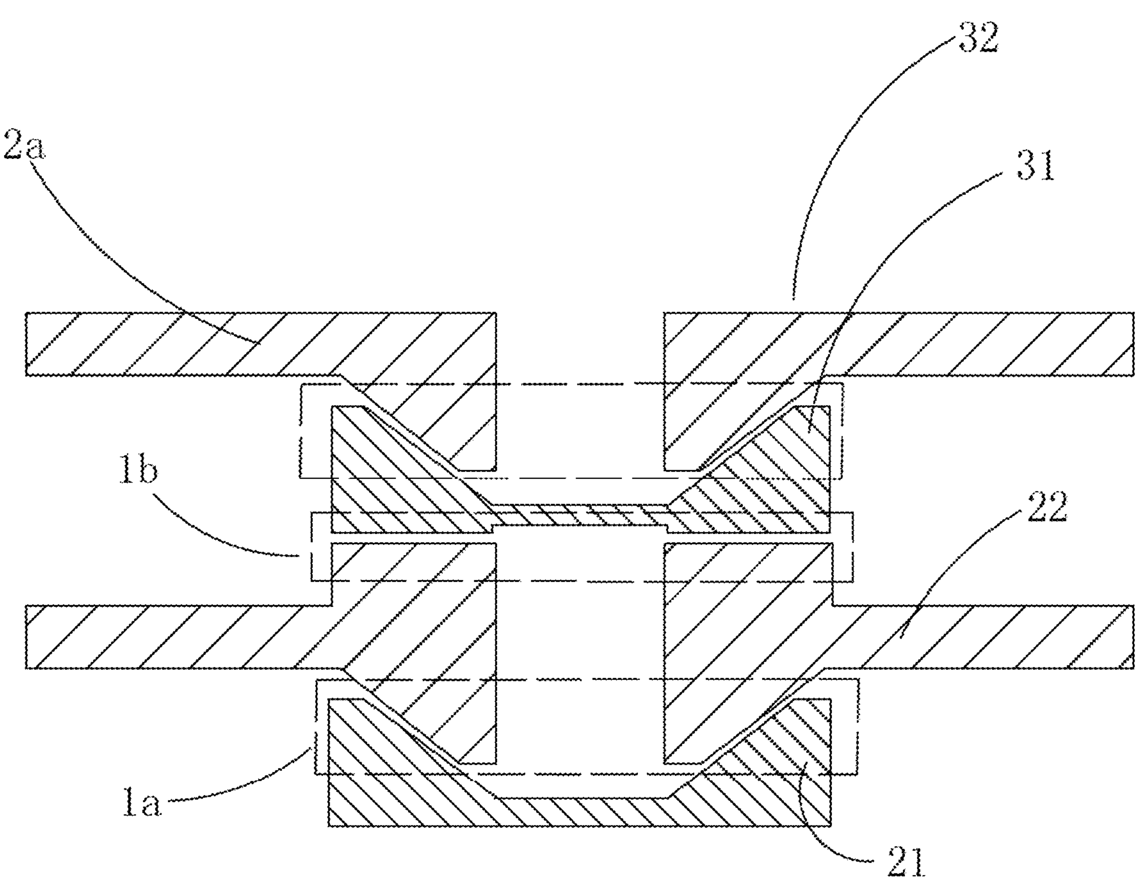
FIG. 20 is a thirteenth schematic view of a contact surface according to some embodiments of the present disclosure.

The example illustrated in FIG. 20 is based on the example illustrated in FIG. 14, where the second helical pair 2*a* is replaced with the first planar friction pair 1*b*. The assembly includes two sets of helical pairs and one set of planar friction pairs, and the transmission effects of the assembly are the same as those in the example illustrated in FIG. 17.

Figure 21:
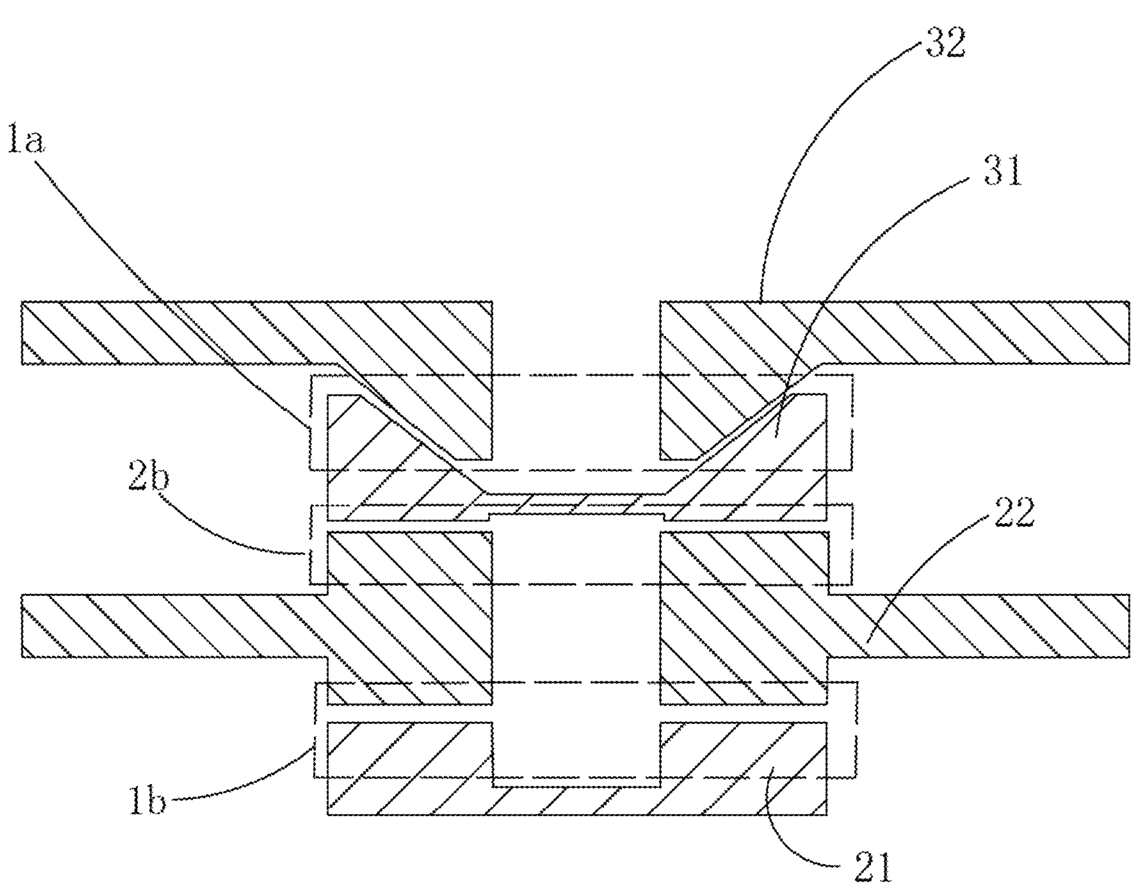
FIG. 21 is a fourteenth schematic view of a contact surface according to some embodiments of the present disclosure.

The example illustrated in FIG. 21 is based on the example illustrated in FIG. 14, where the first helical pair 1*a* and the second helical pair 2*a* are replaced with the first helical pair 1*a* is replaced with the first planar friction pair 1*b*. The assembly includes one set of helical pairs and two sets of planar friction pairs, and the transmission effects of the assembly are the same as those in the example illustrated in FIG. 18.

In this embodiment, in the example illustrated in FIG. 2, the thread directions of the left and right lead screws 11 are opposite.

In some cases, for ease of a transmissive connection to the motor assembly 5, the thread directions of the left and right lead screws 11 may also be set to be the same.

In some embodiments, the thread directions of the left and right lead screws 11 are opposite, and the directions are set to be favorable for the rotation of the rotation arms, that is, during motorized unfolding or folding, the rotation direction of the lead screws 11 is the same as the rotation direction of the rotation arms.

In this embodiment, the first flip drive assembly 2 and the second flip drive assembly 3 achieve axial clamping by arranging axial securing shoulders at the two ends of the lead screws 11, or by securely connecting the rotation arms on a same side at a top portion of the first flip drive assembly 2 and a bottom portion of the second flip drive assembly 3, or by securely connecting the sliders at a top portion of the first flip drive assembly 2 and a bottom portion of the second flip drive assembly 3.

In this embodiment, the spring assembly 4 is clamped between the lead screws 11 and positioned between the first slider 21 and the second slider 31, and is provided with a pre-load force; and the lead screws 11 are driven by the motor assembly 5 to drive the nut 12 to move along the axial direction of the lead screws 11, such that the nut 12 presses against the first slider 21 or the second slider 31 to enable rotation of the first rotation arm 22 and the second rotation arm 32. The motor assembly 5 drives the lead screws 11 to rotate to drive the nut 12 to compress the spring assembly 4, such that the spring assembly 4 generates a corresponding thrust on the first slider 21, such that the first rotation arm 22 experiences a torque in the first flipping direction, and thus the first rotation arm 22 rotates towards the first flipping direction. In the meantime, the motor assembly 5 drives the lead screws 11 to rotate to drive the nut 12 to compress the spring assembly 4, such that the spring assembly 4 generates a corresponding thrust on the second slider 31, such that the second rotation arm 32 experiences a torque in the second flipping direction, and thus the second rotation arm 32 rotates towards the second flipping direction. In the case that the rotation arms on the same side of the first flip drive assembly 2 and the second flip drive assembly 3 rotate in coordination, their torques cancel out each other, and the first rotation arm 22 and second rotation arm 32 do not rotate. Under the action of the spring assembly 4, the helical surfaces of the first flip drive assembly 2 and the second flip drive assembly 3 exert a contact force. This contact force causes frictional resistance during the relative movement between the rotation arms and the sliders. This frictional resistance helps to maintain the stability of the first rotation arm 22 and second rotation arm 32, thereby ensuring the hovering stability.

In this embodiment, the spring assembly 4 includes a first spring 41 and a second spring 42. The first spring 41 is clamped between the first slider 21 and the nut 12, and the second spring 42 is clamped between the first slider 31 and the nut 12. The first spring 41 between the nut 12 and the first slider 21, and the second spring 42 between the second slider 31 and the nut 12, and a pre-load force is applied. The first spring 41 applies an upward thrust to the first slider 21, such that the first rotation arm 22 experiences a torque in the first flipping direction, and thus the first rotation arm 22 rotates towards the first flipping direction. The second spring 42 applies a downward thrust to the second slider 31, such that the second rotation arm 32 experiences a torque in the second flipping direction, and thus the second rotation arm 32 rotates towards the second flipping direction. Optionally, one or more springs may be provided.

Specifically, by controlling the motor assembly 5 to rotate in a specific direction (such as a first rotation direction of the motor), the lead screw 11 is capable of driving the nut 12 to move upwards. As the nut 12 moves upwards, the first slider 21 is driven upwards via the spring assembly 4. In this case, an axial press force of the second flip drive assembly 3 decreases, such that the torque in the second flipping direction is reduced. As the nut 12 moves upwards, the first spring 41 is compressed, and the pressure of the first spring 41 is increased. This leads to an increase in the axial press force of the first flip drive assembly 2 and an increase in the torque in the first flipping direction. Thus, during the upward movement of the nut 12, the torque in the second flipping direction of the second flip drive assembly 3 decreases, whereas the torque in the first flipping direction of the first flip drive assembly 2 increases. A resulting total torque is the first flipping direction torque, which drives the two first arms 22 to rotate in the first flipping direction.

By controlling the motor assembly 5 to rotate in the opposite direction (e.g., a second rotation direction of the motor, which is opposite to the first motor rotation direction), the lead screw 11 is capable of driving the nut 12 to move downwards. As the nut 12 moves downwards, the second slider 31 is driven downwards via the spring assembly 4. In this case, an axial press force of the first flip drive assembly 2 decreases, such that the torque in the first flipping direction is reduced. As the nut 12 moves downwards, the second spring 42 is compressed, and the pressure of the second spring 42 is increased. This leads to an increase in the axial press force of the second flip drive assembly 3 and an increase in the torque in the second flipping direction. Thus, during the downward movement of the nut 12, the torque in the first flipping direction of the first flip drive assembly 2 decreases, whereas the torque in the second flipping direction of the second flip drive assembly 3 increases. A resulting total torque is the torque in the second flipping direction, which drives the two second arms 32 to rotate in the second flipping direction.

The pre-load force of the first spring 41 and the second spring 42 ensures that the lead screws of the first flip drive assembly 2 and the second flip drive assembly 3 have a contact force. This contact force creates frictional resistance during relative movement between the helical pairs, thereby resulting in rotational resistance between the arms and the slides. This frictional resistance helps maintain the hovering stability of the first rotation arm 22 and the second rotation arm 32.

Figure 22:
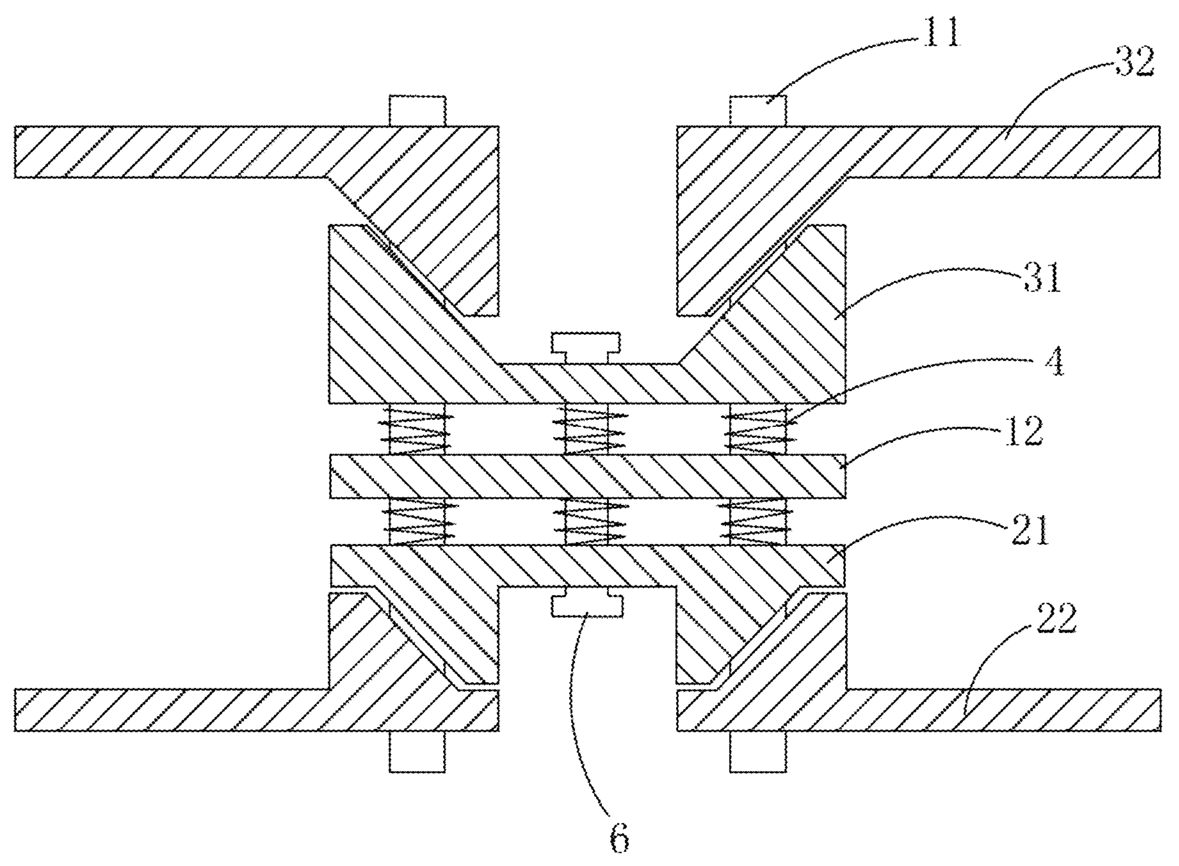
FIG. 22 is a first schematic view of a spring assembly according to some embodiments of the present disclosure.

In this embodiment, as illustrated in the example in FIG. 2, springs are arranged between the nut 12 and the sliders of the first flip drive assembly 2/the second flip drive assembly 3, positioned between the left and right lead screws 11, with one set of springs as illustrated in FIG. 22. In practice, different numbers and arrangements of springs may be used. Using a plurality of springs may increase the axial press force of the drive assemblies, thereby increasing the frictional resistance and improving the hovering stability.

In the example illustrated in FIG. 22, there are two sets of upper and lower springs, with each set sleeved on the left and right lead screws 11. Optionally, three sets of upper springs and three sets of lower springs are provided. Two sets of springs are sleeved in a left-right configuration on the left and right lead screws 11, and one set of springs are centrally arranged. Optionally, two sets of upper springs and two sets of lower springs are provided, and are arranged in a centralized configuration between the left and right lead screws 11.

Figure 23:
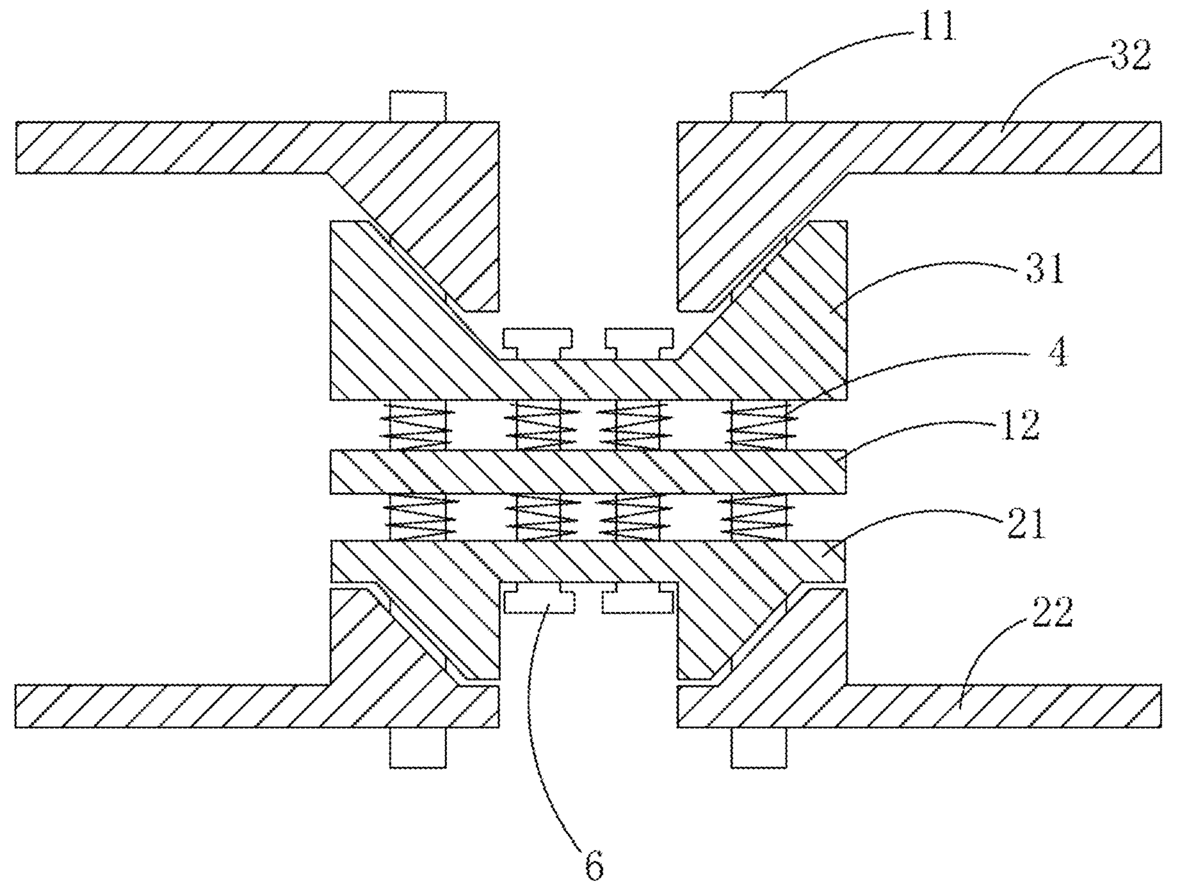
FIG. 23 is a second schematic view of a spring assembly according to some embodiments of the present disclosure.

As illustrated in the example in FIG. 23, four sets of upper springs and four sets of lower springs are provided. Two sets of springs are sleeved in a left-right configuration on the left and right lead screws 11, and two sets of springs are arranged in a centralized configuration between the left and right lead screws 11. Optionally, the connection between the upper and lower springs and the nut 12 may also be implemented by using a single integral long spring and securing the middle portion of the spring to the nut 12.

In this embodiment, the motorized hinge drive device 100 further includes a pull rod 6 secured to the nut 12; wherein a securing shoulder 66 is arranged at each of two ends of the pull rod 6, the pull rod 6 successively passes through the first slider 21, the nut 12, and the second slider 31, and the two ends of the pull rod 6 are respectively in abutment against sides, away from the nut 12, of the first slider 21 and the second slider 31, and the first spring 41 and the second spring 42 are respectively sleeved on the pull rod 6.

In this embodiment, the pull rod 6 includes a pull rod body 61, a first shaft collar 62 protruding from one end of the pull rod body 61, a securing groove 63 formed by a recess in a middle portion of the pull rod body 61, and a first recess 64 formed in the other end of the pull rod body 61. The nut 12 includes a nut body 121, two female thread structures 122 formed through the nut body 121, and a bayonet 123 extending through the nut body 121; wherein the two lead screws 11 respectively pass through the two female thread structures 122 and are threadedly connected to the two female thread structures 122, and the bayonet 123 is engaged in the securing groove 63 and arranged in the bayonet 123, the first spring 41 is sleeved around the pull rod body 61 and positioned between the first slider 21 and the nut body 121, the second spring 42 is sleeved around the pull rod body 61 and positioned between the second slider 31 and the nut body 121, and a first retaining ring 65 is arranged within the first recess 64, wherein the first retaining ring 65 is in abutment against a side, away from the nut 12, of the first slider 21, and a side, away from the nut 12, of the second slider 31 is in abutment against the first shaft collar 62.

Optionally, the nut 6 further includes a limiting groove 125 formed by recessing from a side, close to the second flip drive assembly 3, of the nut body 121 towards a side, away from the second flip drive assembly 3, of the nut body 121.

In this embodiment, the motorized hinge drive device 100 further includes a pull rod 6; wherein the pull rod 6 includes two pull rod bodies 61' secured to two opposite sides of the nut 12 and two securing shoulders 66 formed by bending and extending an end portion, away from the nut 12, of the pull rod body 6 along the axial direction of the lead screws 11, wherein the two pull rod bodies 61' are arranged along the axial direction of the lead screws 11. The nut 12 includes a nut body 121', two female thread structures 122 formed through the nut body 121', and a mounting slot 124 passing through the nut body 121' and positioned between the two female thread structures 122; wherein the two lead screws 11 respectively pass through the two female thread structures and are threadedly connected to the two female thread structures 122, the spring assembly 4 is arranged within the mounting slot 124, and two ends of the spring assembly 4 are respectively in abutment against the two securing shoulders 66. In the case that the lead screw 11 drives the nut 12 upwards, the securing shoulder 66 on the side of the second flip drive assembly 3 pulls the second slider 31 of the second flip drive assembly 3 upwards. In the case that the nut 12 moves downwards, the securing shoulder 66 on the side away from the second flip drive assembly 3 pulls the first slider 21 of the first flip drive assembly 2 downwards. The use of the pull rod 6 reduces the friction resistance during the motorized opening and closing, thereby improving the drive force.

Specifically, the pull rod 6 is secured to the nut 12 to transmit the thrust of the nut 12 in a specific manner to the bottom slider of the first flip drive assembly 2 and the top slider of the second flip drive assembly 3. This helps to reduce friction resistance during the motorized opening and closing process. The securing shoulders 66 are arranged at both ends of the pull rod 6. As the nut 12 moves upwards or downwards, the sliders of the second flip drive assembly 3 or the first flip drive assembly 2 is pulled upwards or downwards via the securing shoulders 66. In the example illustrated in FIG. 2, the pull rod 6 is axially secured by the bayonet 123 in the middle of the nut 12, which is in engagement with the securing groove 63 in the pull rod 6. One of the securing shoulders 66 of the pull rod 6 is implemented as a shaft collar, and the other securing shoulder 66 is implemented by engagement between the retaining ring and a retaining ring groove in the pull rod 6.

In practice, one or more pull rods 6 may be provided. The pull rod 6 may be axially secured to the nut 12 in any other manners, such as integral molding, welding, or the like. The securing shoulders 66 at both ends of the pull rod 6 may also be secured in any other manners. The pull rod 6 is not necessarily cylindrical, but may be any structure with the securing shoulders 66 at both ends.

The pull rod 6 may be plate-shaped and securely connected to the nut 12. The intermediate spring passes through the nut 12 and is in direct contact with the sliders of the first flip drive assembly 2 and the second flip drive assembly 3.

Optionally, the motorized opening and closing as well as the hovering function may be implemented without the pull rod 6. In this case, the nut 12 transmits a thrust to the bottom slider of the first flip drive assembly 2 or the top slider of the second flip drive assembly 3 via the spring or direct contact.

In this embodiment, each of the lead screws 11 includes a lead screw body 111, a male thread structure 112 formed through the lead screw body 111, a second shaft collar 113 protruding from one end of the lead screw body 111, and a second recess 114 formed in the other end of the lead screw body 111, wherein the nut 12 is threadedly connected to the male thread structure 112, a second retaining ring 116 is arranged within the second recess 114; wherein each of the rotation arms 22 is sleeved around one of the lead screw bodies 111 and is in abutment against a corresponding second retaining ring 116, and each of the second rotation arms 32 is sleeved on the other end of one of the lead screw bodies 111 and is in abutment against a corresponding second shaft collar 113.

Figure 24:
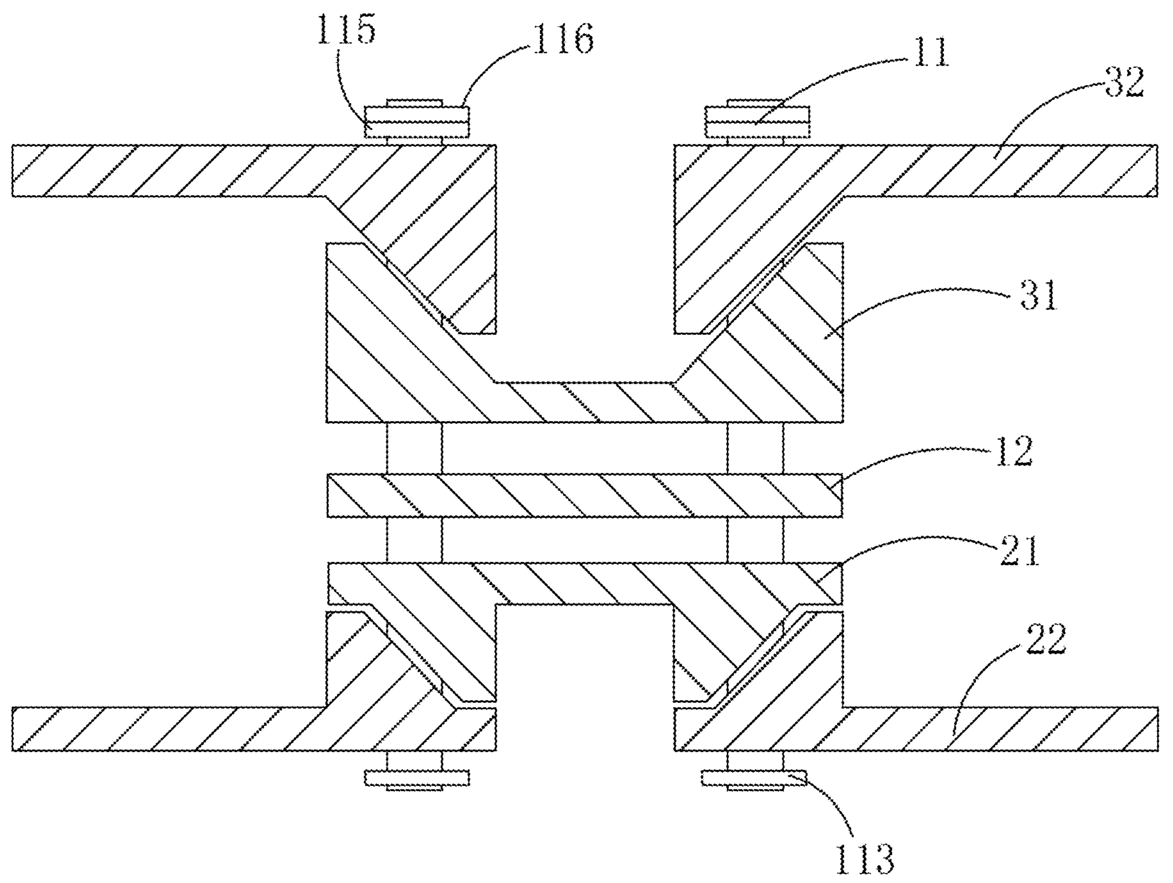
FIG. 24 is a first schematic view illustrating axial clamping of lead screws according to some embodiments of the present disclosure.

Specifically, the first flip drive assembly 2 and the second flip drive assembly 3 require axial clamping to function properly as part of the motorized hinge mechanism. The axial clamping is achieved by arranging two axial securing shoulders 66 on the lead screw 11, as illustrated in FIG. 24. One securing shoulder 66 is a shaft collar, while the other securing shoulder 66 is composed of an open retaining ring and a washer 115. The retaining ring is in engagement with the retaining ring groove on the lead screw 11 to achieve axial securing, while the washer 115 is shaped with a special hole that fits with an irregular end section of the lead screw 11, such that the washer 115 is allowed to rotate with the lead screw 11, thereby preventing wear on the retaining ring. The use of the retaining ring allows for easy mounting and dismounting, and other axial securing approaches may also be employed in practice. In examples where a plurality of helical pairs are stacked, this approach is also employed.

Figure 25:
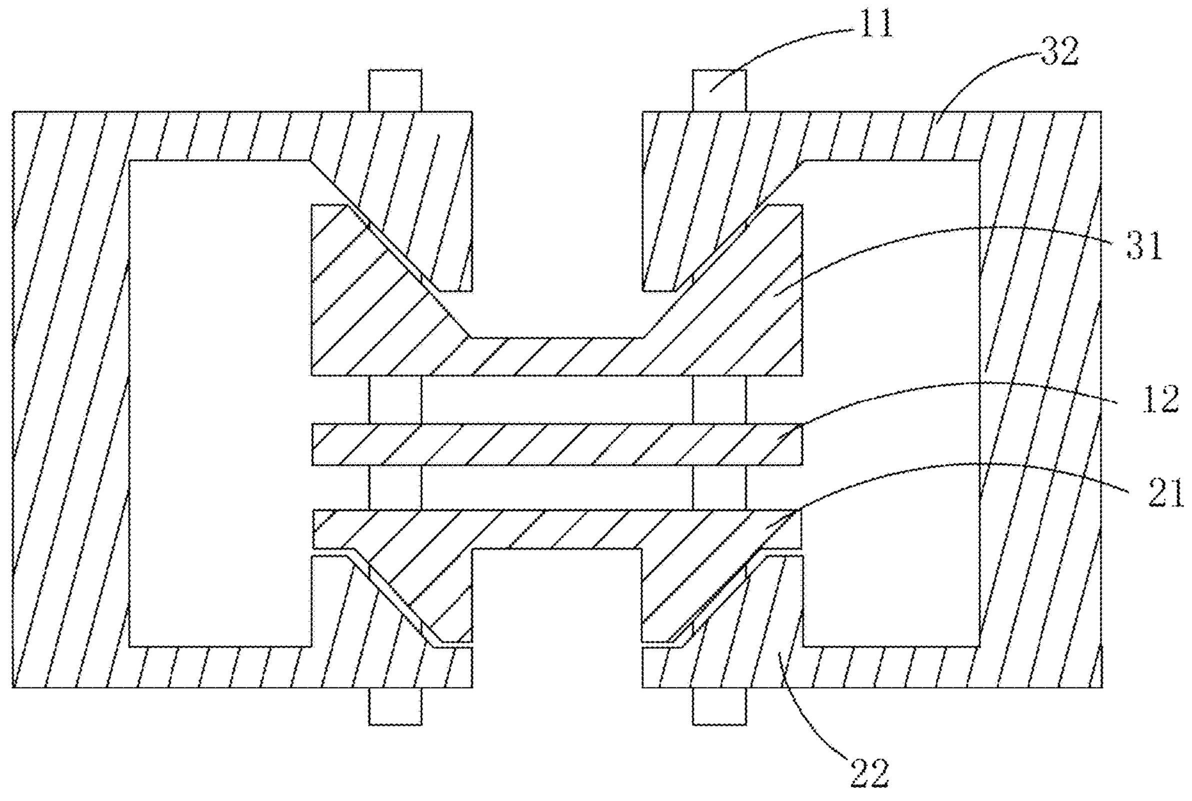
FIG. 25 is a second schematic view illustrating axial clamping of lead screws according to some embodiments of the present disclosure.

Axial clamping may also be achieved by securely connecting the top rotation arm of the first flip drive assembly 2 and the bottom rotation arm of the same side of the second flip drive assembly 3. In the case that a rotation arm is arranged at the top of the first flip drive assembly 2, and a rotation arm is arranged at the bottom of the second flip drive assembly 3, this approach may also be employed to achieve more compact axial dimensions. The example illustrated in FIG. 25 is based on the example illustrated in FIG. 2, where the rotation arms on the same side are securely connected to achieve axial clamping. In examples where a plurality of helical pairs are stacked, this approach is also employed.

Figure 26:
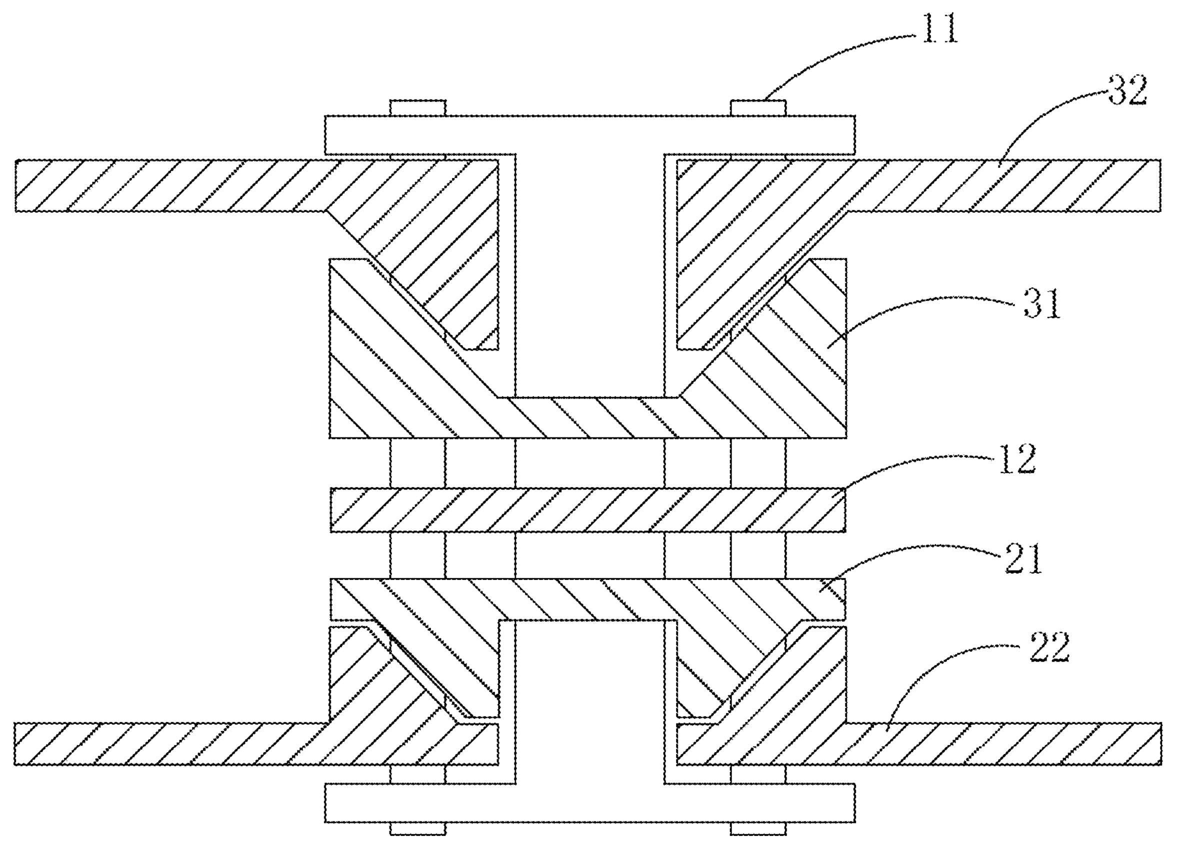
FIG. 26 is a third schematic view illustrating axial clamping of lead screws according to some embodiments of the present disclosure.
Figure 27:
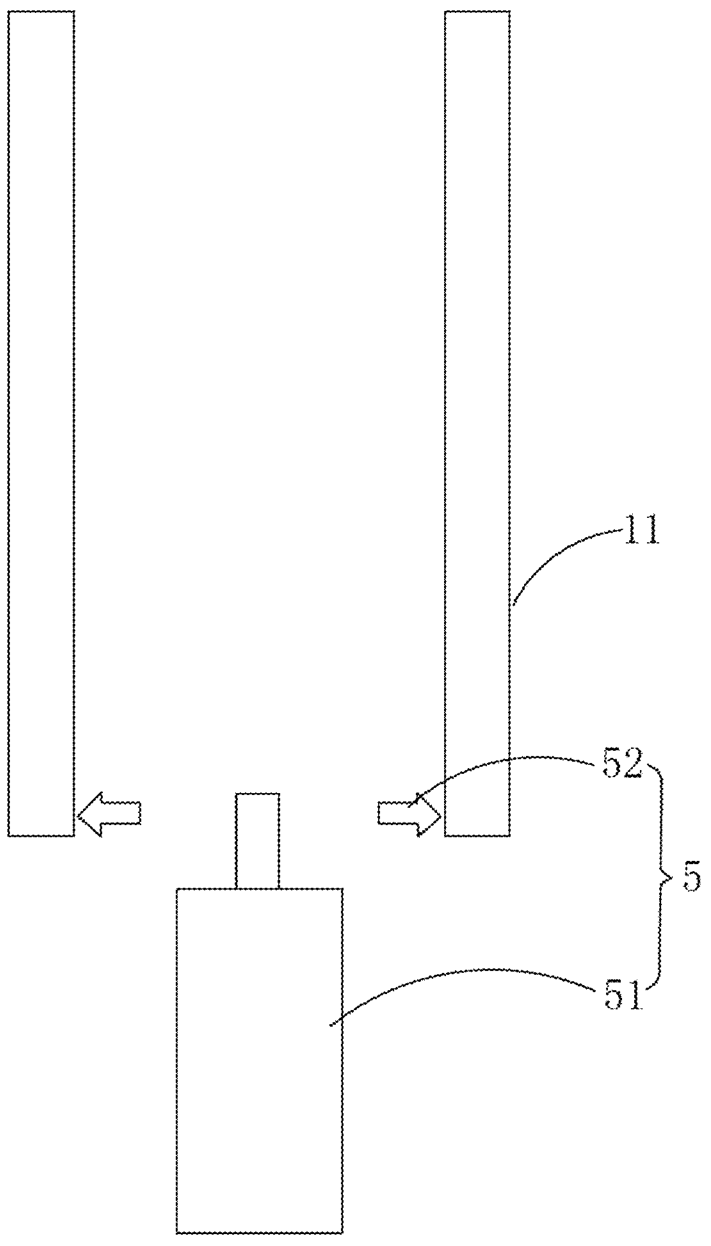
FIG. 27 is a first schematic view illustrating power transmission of a motor according to some embodiments of the present disclosure.

In the case that a slider is arranged at the top of the first flip drive assembly 2, and a slider is arranged at the bottom of the second flip drive assembly 3, the top slider of the first flip drive assembly 2 and the bottom slider of the second flip drive assembly 3 may be securely connected to achieve clamping, and the axial dimensions are more compact. The example illustrated in FIG. 26 is an example of clamping achieved by securely connecting the sliders. In examples where a plurality of helical pairs are stacked, this approach is also employed.

In this embodiment, the motor assembly 5 includes a motor 51, a reducer transmissively connected to an output shaft of the motor 51, and a transmission assembly 52 connected to the reducer; wherein the transmission assembly 52 is transmissively connected to the lead screws 11.

Specifically, in the case that the motor 51 starts running, the left and right lead screws 11 are driven via the transmission assembly 52. The rotation of the lead screws 11 drives the nut 12 to move either upwards or downwards. By controlling the rotation direction of the motor 51, the movement direction of the nut 12 is controlled.

In the case that the nut 12 moves upwards, the bottom slider of the first flip drive assembly 2 is driven to move upwards. Under the action of the internal helical pair of the drive assembly, the torque in the first flipping direction of the first flip drive assembly 2 increases, while the torque in the second flipping direction of the second flip drive assembly 3 decreases. An overall torque of the motorized hinge drive device 100 generates a torque in the first flipping direction, thereby driving the rotation arm to rotate in the first flipping direction.

In the case that the nut 12 moves downwards, the top slider of the second flip drive assembly 3 is driven to move downwards. Under the action of the internal helical pair of the drive assembly, the torque in the second flipping direction of the second flip drive assembly 3 increases, while the torque in the first flipping direction of the first flip drive assembly 2 decreases. An overall torque of the motorized hinge drive device 100 generates a torque in the second flipping direction, thereby driving the rotation arm to rotate in the second flipping direction.

In the case that the nut 12 is stationary, the first flip drive assembly 2 and the second flip drive assembly 3 generate torques in the first and second flipping directions under the action of the springs. A combined force of both torques is insufficient to overcome the rotational friction resistance of the rotation arm, and thus the rotation arm in a hovering state.

In this embodiment, the transmission assembly 52 is a gear transmission assembly.

In this embodiment, the torque output by the motor assembly 5 is transmitted to the left and right lead screws 11 via the transmission assembly 52. The transmission assembly 52 may be gear, worm gear, or belt transmission. The power from the motor assembly 5 may be introduced from either end of the lead screw 11 or from both ends simultaneously. One or more motor assemblies 5 may be provided. Different quantities and layouts of motor assemblies 51 may be used according to actual needs. In the example illustrated in FIG. 27, one motor assembly 5 simultaneously transmits power to left and right lead screws 11.

Figure 28:
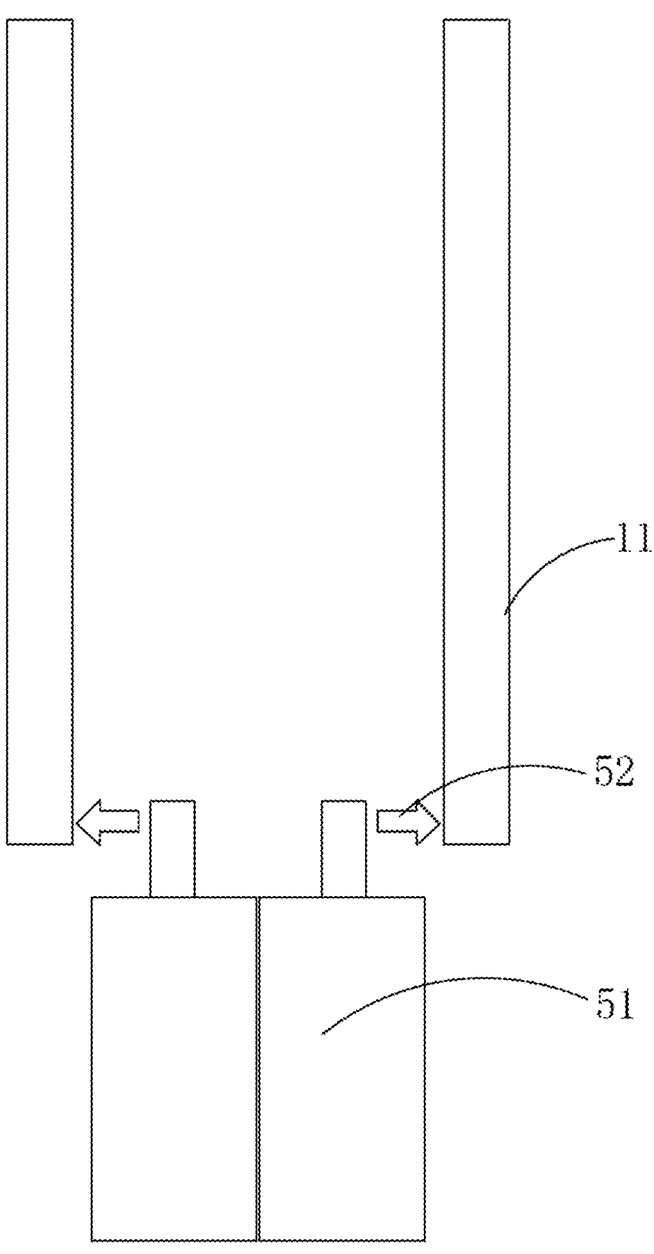
FIG. 28 is a second schematic view illustrating power transmission of a motor according to some embodiments of the present disclosure.

In the example illustrated in FIG. 28, two motor assemblies 5 respectively transmit power to left and right lead screws 11.

Figure 29:
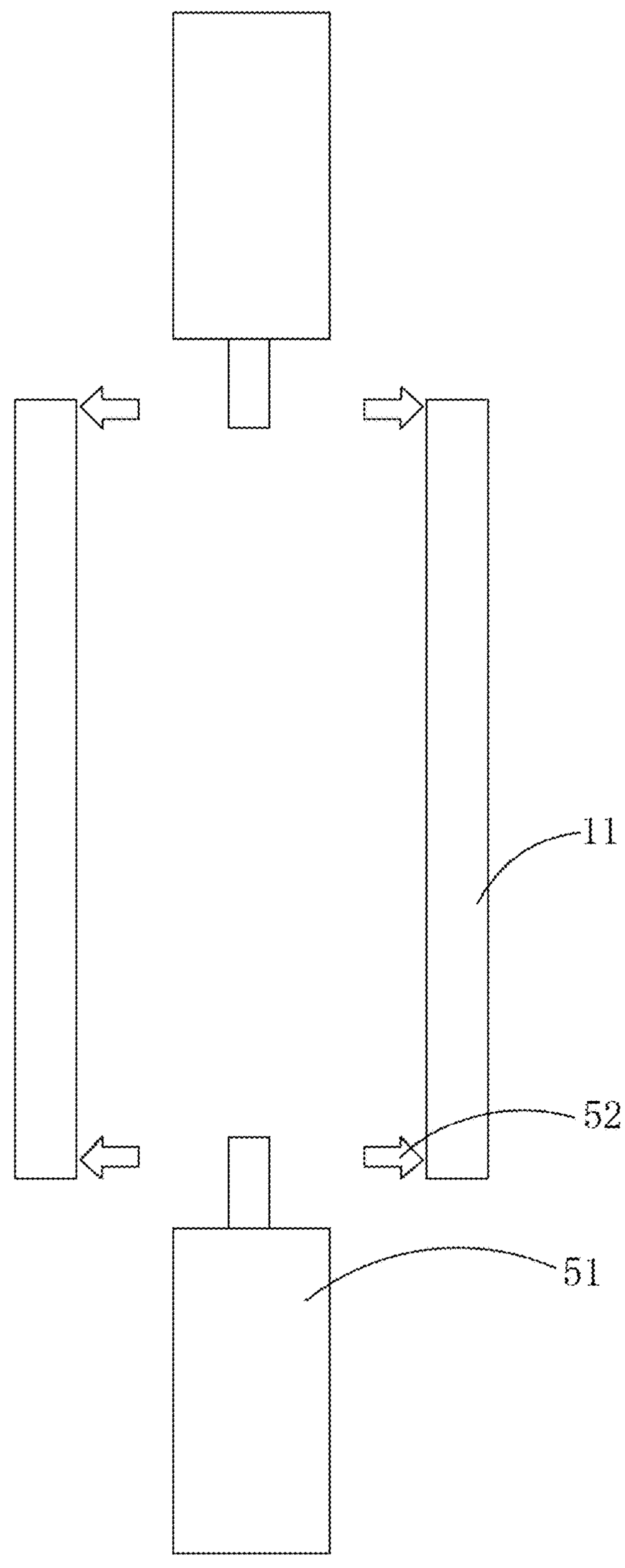
FIG. 29 is a third schematic view illustrating power transmission of a motor according to some embodiments of the present disclosure.

In the example illustrated in FIG. 29, two motor assemblies 5 simultaneously transmit power to left and right lead screws 11 from both ends.

Figure 30:
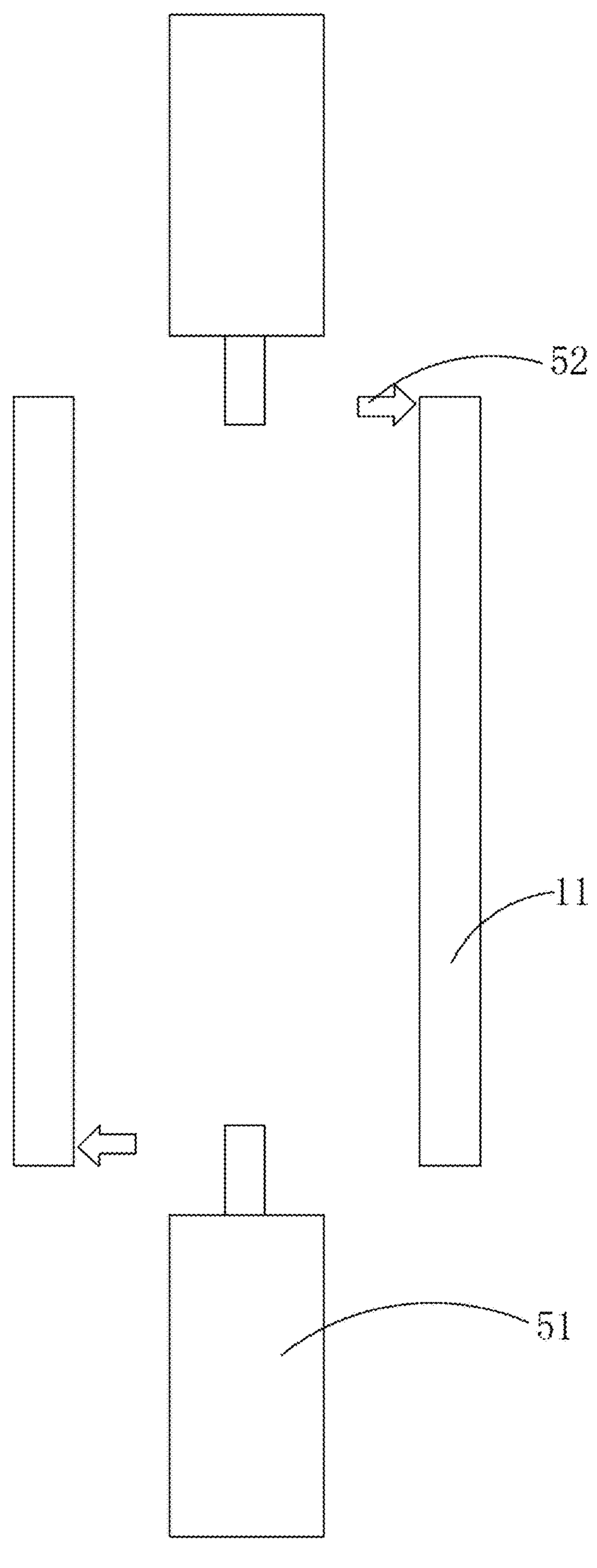
FIG. 30 is a fourth schematic view illustrating power transmission of a motor according to some embodiments of the present disclosure.

In the example illustrated in FIG. 30, two motor assemblies 5 respectively transmit power to left and right lead screws 11 from both ends.

Figure 31:
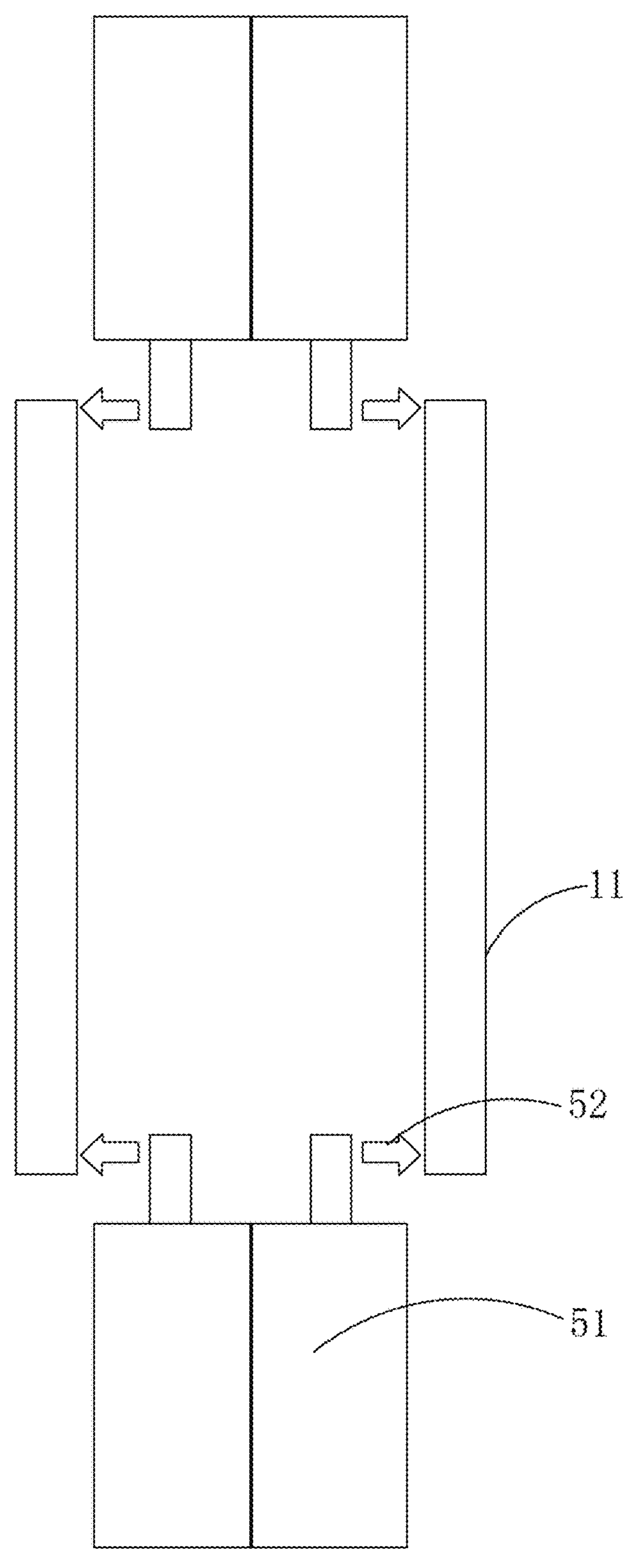
FIG. 31 is a fifth schematic view illustrating power transmission of a motor according to some embodiments of the present disclosure.

In the example illustrated in FIG. 31, four motor assemblies 5 simultaneously transmit power to left and right lead screws 11 from both ends.

Specifically, as illustrated in FIGS. 1 to 7, in the case that the output shaft of the motor assembly 5 is coaxial or parallel to the lead screws 11, transmission patterns such as direct coupling, gear transmission, or belt transmission may be used. The output shaft of the motor assembly 5 and the lead screw 11 are engaged via internal and external gears to achieve a transmissive connection. Meanwhile, in the case that the output shaft of the motor assembly 5 is coaxial with the lead screw 11, a direct coupling transmission pattern is used. Optionally, a single-stage gear transmission pattern is used. Optionally, a two-stage gear transmission pattern may also be employed. In the case that the output shaft of the motor assembly 5 is parallel but not coaxial with the lead screw 11, and the distance between the axes is small, an internal gear transmission pattern may also be used. The internal gear transmission pattern is used, where the internal gear is connected to the lead screws 11 and the external gear is connected to the motor assembly 5.

Optionally, an internal gear transmission method may also be used, where the internal gear is connected to the motor assembly 5, and the external gear is connected to the lead screw 11. In the case that a single motor assembly 5 is capable of transferring power to the left and right lead screws 11 via a gear transmission pattern, the motor assembly 5 is directly coupled to the left lead screw 11 and transmits power to the right lead screw 11 via four sequentially meshed and engaged gears.

Optionally, the motor assembly 5 may also be directly coupled to an intermediate gear to transfer power to the left and right lead screws 11.

Optionally, in the case that the output shaft of the motor assembly 5 is not coaxial with the intermediate gear, single-stage gear transmission may also be added to achieve non-coaxial power transmission.

Considering different actual sizes and space requirements, in two-stage gear transmission for transferring power from a single motor assembly 5 to the left and right lead screws 11, various gear transmission patterns are involved, which are not described in detail herein.

Second Embodiment

With reference to FIGS. 1 to 42, an embodiment of the present disclosure provides a hinge device 200. The hinge device 200 includes: a framework 201, two connection arms 202 oppositely arranged, and the motorized hinge drive device 100 as described above. The motorized hinge drive device 100 is mounted on the framework 201, the first rotation arm 22 and the second rotation arm 32 of the motorized hinge drive device 100 are both connected to an external device, and two ends of each of the two connection arms 202 is in transmissive connection to the framework 201 and the external device. It should be noted that the connection between the first rotation arm 22 and the second rotation arm 32 with the external device should ensure that the rotation arms on the same side of the first and second rotation arms 22 and 32 rotate in coordination.

In this embodiment, the first rotation arm 22 and the second rotation arm 32 are rotatably or slidably connected to the external device.

Specifically, the motorized hinge drive device 100 may be used in combination with any foldable electronic device hinge to achieve a motorized opening and closing function. The motorized hinge driving device 100 is mounted on the framework 201, and the rotation arms of the motorized hinge driving device 100 are connected to the body of the foldable electronic device to drive the opening and closing of the body. The connection between the rotation arm and the body may be any of secure connection, rotatable connection, slidable connection, or slider-slot connection, as illustrated in FIGS. 36 to 39.

Figure 40:
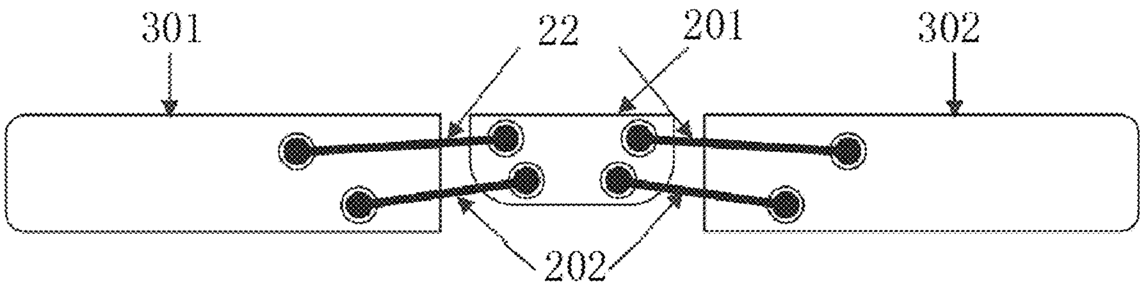
FIG. 40 is a fifth schematic structural view of a hinge device according to some embodiments of the present disclosure.
Figure 41:
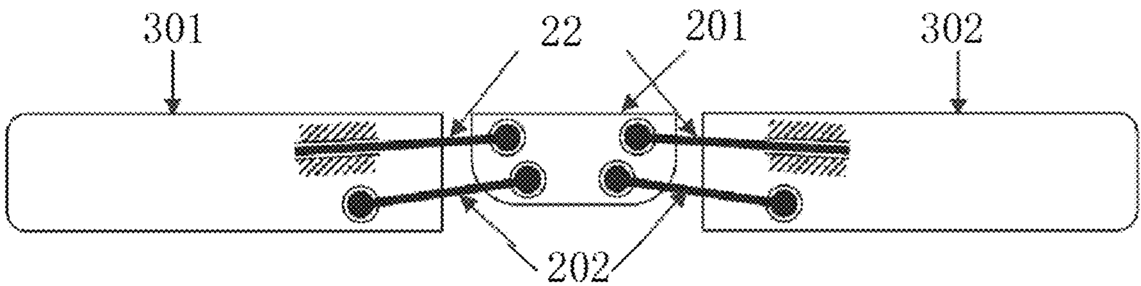
FIG. 41 is a sixth schematic structural view of a hinge device according to some embodiments of the present disclosure.
Figure 42:
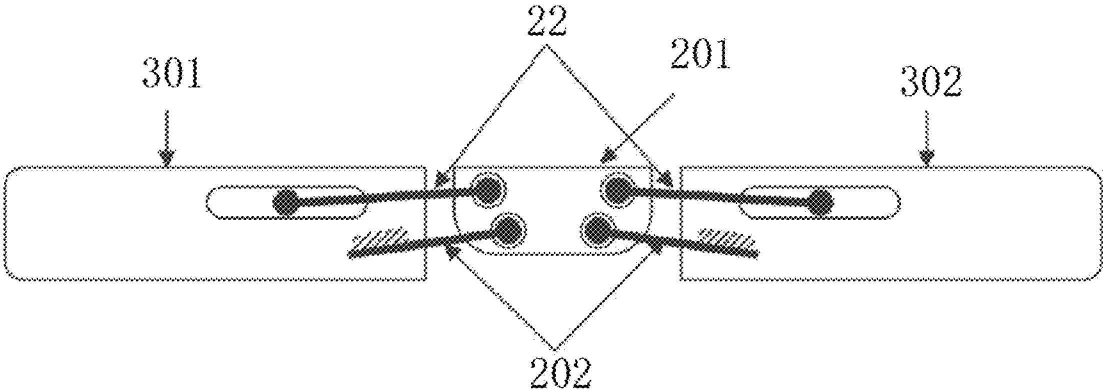
FIG. 42 is a seventh schematic structural view of a hinge device according to some embodiments of the present disclosure.

In order to meet the requirements of different motion trajectories, the hinge section may also be equipped with connection arms 202 arranged in a left-right symmetric configuration. Both ends of the connection arms 202 are rotatably connected to the body and the framework 201. The left/right connection arms 202, the rotation arms, the body, and the framework 201 together form different types of four-bar linkage mechanisms, as illustrated in FIGS. 40 to 42.

In a hinge for a foldable electronic device, one or more sets of the motorized hinge driving devices 100 may be used.

An optional embodiment of the present disclosure provides a hinge device 200. The hinge device 200 includes: a framework 201 and the motorized hinge drive device 100 as described above. The motorized hinge drive device 100 is mounted on the framework 201, the first rotation arm 22 and the second rotation arm 32 of the motorized hinge drive device 100 are both in secure connection to the external device.

An optional embodiment of the present disclosure provides a hinge device 200. The hinge device 200 includes: a framework 201 and the motorized hinge drive device 100 as described above. The motorized hinge drive device 100 is mounted on the framework 201, the first rotation arm 22 and the second rotation arm 32 of the motorized hinge drive device 100 are both in a slider slot connection to an external device, one end of the connection arm 202 is in rotatable connection to the framework 201, and the other end of the connection arm 202 is in secure connection to the external device.

Third Embodiment

An embodiment of the present disclosure provides an electronic device. The electronic device includes: a first body 301, a second body 302, a triggering module, a smart controller, and the hinge device 200 as described above. The triggering module and the smart controller are respectively mounted within the first body 301 and/or the second body 302. The hinge device 200 is connected to the first body 301 and/or the second body 302.

The first rotation arm 22 and the second rotation arm 32 may be in any of rotatable connection, slidable connection, or slider-slot connection to the hinge device 200.

The triggering module is configured to generate a trigger signal in response to an operation by a user.

The smart controller is configured to, based on the trigger signal, control the hinge device 200 to operate. The triggering module is configured to generate a trigger signal in response to an operation by a user; and the smart controller is capable of controlling start, steering, rotation speed of the motor 51 based on the trigger signal.

In this embodiment, the triggering module includes at least one or a combination of two or more of a key module, a fingerprint recognition module, an image acquisition module, or a voice input module.

In this embodiment, the electronic device further includes: a sensor. The sensor is configured to detect a relative position and a relative motion state of the first body 301 and the second body 302, and/or an acting force exerted by the hinge device 200 to the first body 301 and/or the second body 302. The smart controller is configured to, based on information detected by the sensor, determine usage of the electronic device, output a control signal for the motor 51, control the hinge device 200 to operate, and assist the user to operate the electronic device.

In this embodiment, the example of the motorized hinge drive device 100 is applicable to a foldable electronic device. The electronic device further includes a triggering module and a smart controller. The triggering module is configured to generate a trigger signal in response to an operation by a user; and the smart controller is capable of controlling start, steering, rotation speed of the motor 51 based on the trigger signal. The triggering module includes at least one of a key module, a fingerprint recognition module, an image acquisition module, or a voice input module.

In this embodiment, the example of the motorized hinge driving device 100 is applicable to a foldable electronic device. The electronic device further includes a sensor and a smart controller. The sensor is configured to detect a relative position and a relative motion state of the first body 301 and the second body 302, and/or an acting force exerted by the hinge to the first body 301/second body 302. The smart controller is configured to, based on information detected by the sensor, determine usage of the electronic device, output a control signal for the motor 51, and assist the user to operate the foldable electronic device, such as assisting in unfolding/folding, automatic flattening/folding locking.

As compared with the related art, in the motorized hinge drive device according to the present disclosure, the second flip drive assembly and the first flip drive assembly are positioned on opposite sides of the nut or a same side of the nut, and are axially clamped at two ends of the two lead screws, such that the motor assembly drives the lead screw and nut assembly to compress the spring assembly to drive the first flip drive assembly to flip towards the first flipping direction or drive the second flip drive assembly to flip towards the second flipping direction; the two lead screws are threadedly transmissively connected to the nut and are transmissively connected to the motor assembly, the first slider and the first rotation arm are successively stacked along the axial direction of the lead screws towards the direction away from the nut, and the first slider is slidably connected to the lead screws along the axial direction of the lead screws; the first contact surface is defined on the side, close to the first rotation arm, of the first slider, the second contact surface is defined on the side, close to the first slider of the first rotation arm, the first contact surface is in abutment against the second contact surface, and the first slider presses against the first rotation arm to cause the first rotation arm to rotate towards the first flipping direction, wherein the first flipping direction is an unfolding direction or a folding direction; the second flip drive assembly and the first flip drive assembly are respectively on two opposite sides of the nut, the second slider and the second rotation arm are successively stacked along the axial direction of the lead screws towards the direction away from the nut, the second slider is slidably connected to the lead screws along the axial direction of the lead screws; the third contact surface is defined on the side, close to the second rotation arm, of the second slider, the fourth contact surface is defined on the side, close to the second slider, of the second rotation arm, the third contact surface is in abutment against the fourth contact surface, and the second slider presses against the second rotation arm to cause the second rotation arm to rotate along the lead screws towards the second flipping direction, and the first flipping direction is opposite to the second flipping direction; the spring assembly is clamped between the first slider and the second slider and is provided with the pre-load force, and the lead screws are driven by the motor assembly to drive the nut to move along the axial direction of the lead screws, such that the nut presses against the first slider or the second slider to enable rotation of the first rotation arm and the second rotation arm. In this way, it is convenient to achieve automatic unfolding and folding of the electronic device, the output torque of the motor is amplified, the hovering resistance during automatic opening and closing is automatically decreased, which lowers the requirement on the torque of the motor, and during hovering, the flipping resistance is large, and hence the hovering stability is enhanced.

Described above are merely exemplary embodiments of the present disclosure. It should be noted that persons of ordinary skill in the art would make various improvements without departing from the inventive concept of the present disclosure, and such improvements shall fall within the protection scope of the present disclosure.

What is claimed is:

1. A motorized hinge drive device, comprising: a lead screw and nut assembly, a first flip drive assembly, a second flip drive assembly, a spring assembly, and a motor assembly; wherein the lead screw and nut assembly comprises two lead screws arranged oppositely and a nut simultaneously fitted on both of the two lead screws, wherein the two lead screws are threadedly transmissively connected to the nut, and the two lead screws are transmissively connected to the motor assembly; the second flip drive assembly and the first flip drive assembly are positioned on opposite sides of the nut or a same side of the nut; and the second flip drive assembly and the first flip drive assembly are axially clamped at two ends of the two lead screws;

the first flip drive assembly comprises a first slider simultaneously sleeved on the two lead screws and two first rotation arms that are oppositely arranged and are respectively sleeved on the two lead screws; wherein the first slider and the first rotation arm are successively stacked along an axial direction of the lead screws towards a direction away from the second flip drive assembly, and the first slider is slidably connected to the lead screws along the axial direction of the lead screws; and a first contact surface is defined on a side, close to the first rotation arm, of the first slider, and a second contact surface is defined on a side, close to the first slider of the first rotation arm, the first contact surface being in abutment against the second contact surface, and the first slider presses against the first rotation arm to cause the first rotation arm to rotate along the first lead screw towards a first flipping direction, the first flipping direction being an unfolding direction or a folding direction;

the second flip drive assembly comprises a second slider simultaneously sleeved on the two lead screws and two second rotation arms that are oppositely arranged and are respectively sleeved on the two lead screws; wherein the second slider and the second rotation arm are successively stacked along an axial direction of the lead screws towards a direction away from the first flip drive assembly, and the second slider is in sliding connection with the lead screw along the axial direction of the lead screws; a third contact surface is defined on a side, close to the second rotation arm, of the second slider, and a fourth contact surface is defined on a side, close to the second slider, of the second rotation arm, the third contact surface being in abutment against the fourth contact surface, and the second slider presses against the second rotation arm to cause the second rotation arm to rotate along the lead screws towards a second flipping direction, the second flipping direction being opposite to the first flipping direction; and the spring assembly is clamped between the first slider and the second slider, and is provided with a pre-load force; and the lead screws are driven by the motor assembly to drive the nut to move along the axial direction of the lead screws, such that the nut presses against the first slider or the second slider to enable rotation of the first rotation arm and the second rotation arm.

2. The motorized hinge drive device according to claim 1, wherein the spring assembly comprises a first spring and a second spring; wherein the first spring is clamped between the first slider and the nut, and the second spring is clamped between the first slider and the nut.

3. The motorized hinge drive device according to claim 2, further comprising: a pull rod secured to the nut; wherein a securing shoulder is arranged at each of two ends of the pull rod, the pull rod successively passes through the first slider, the nut, and the second slider, and the two ends of the pull rod are respectively in abutment against sides, away from the nut, of the first slider and the second slider, and the first spring and the second spring are respectively sleeved on the pull rod.

4. The motorized hinge drive device according to claim 3, wherein the pull rod comprises a pull rod body, a first shaft collar protruding from one end of the pull rod body, a securing groove formed by a recess in a middle portion of the pull rod body, and a first recess formed in the other end of the pull rod body; and the nut comprises a nut body, two female thread structures formed through the nut body, and a bayonet extending through the nut body; wherein the two lead screws respectively pass through the two female thread structures and are threadedly connected to the two female thread structures, and the bayonet is engaged in the securing groove, the first spring is sleeved around the pull rod body and positioned between the first slider and the nut body, the second spring is sleeved around the pull rod body and positioned between the second slider and the nut body, and a first retaining ring is arranged within the first recess, wherein the first retaining ring is in abutment against a side, away from the nut, of the first slider, and a side, away from the nut, of the second slider is in abutment against the first shaft collar.

5. The motorized hinge drive device according to claim 1, further comprising: a pull rod; wherein the pull rod comprises two pull rod bodies secured to two opposite sides of the nut and two securing shoulders formed by bending and extending an end portion, away from the nut, of the pull rod body along the axial direction of the lead screws, wherein the two pull rod bodies are arranged along the axial direction of the lead screws; and the nut comprises a nut body, two female thread structures formed through the nut body, and a mounting slot extending through the nut body and positioned between the two female thread structures; wherein the two lead screws respectively pass through the two female thread structures and are threadedly connected to the two female thread structures, the spring assembly is arranged within the mounting slot, and two ends of the spring assembly are respectively in abutment against the two securing shoulders.

6. The motorized hinge drive device according to claim 1, wherein each of the lead screws comprises a lead screw body, a male thread structure formed through the lead screw body, a second shaft collar protruding from one end of the lead screw body, and a second recess formed in the other end of the lead screw body; wherein the nut is threadedly connected to the male thread structure, a second retaining ring is arranged within the second recess; wherein each of the first rotation arms is sleeved around one of the lead screw bodies and is in abutment against a corresponding second retaining ring, and each of the second rotation arms is sleeved on the other end of one of the lead screw bodies and is in abutment against a corresponding second shaft collar.

7. The motorized hinge drive device according to claim 1, wherein the motor assembly comprises a motor, a reducer transmissively connected to an output shaft of the motor, and a transmission assembly transmissively connected to the reducer; wherein the transmission assembly is transmissively connected to the lead screws.

8. The motorized hinge drive device according to claim 7, wherein the transmission assembly is a gear transmission assembly.

9. The motorized hinge drive device according to claim 1, wherein the first slider and the two first rotation arms are defined as a first flipping unit, and the second slider and the two second rotation arms are defined as a second flipping unit, one said first flipping unit and one said second flipping unit being arranged; and a contact surface between the first slider and the two first rotation arms is a helical surface, and a contact surface between the second slider and the two second rotation arms is a helical surface.

10. The motorized hinge drive device according to claim 9, wherein at least two said first flipping units and at least two said second flipping units are arranged; wherein adjacent two of the first flipping units are arranged in a mirror-image configuration along a direction perpendicular to the axial direction of the lead screws, and adjacent two of the second flipping units are arranged in a mirror-image configuration along a direction perpendicular to the axial direction of the lead screws; wherein a contact surface between the first slider of at least one of the first flipping units and the two first rotation arms is a helical surface, and a contact surface between the second slider of at least one of the second slipping units and the two second rotation arms is a helical surface.

11. The motorized hinge drive device according to claim 10, wherein the first sliders between the adjacent two of the first flipping units are integrally formed, and the second sliders between the adjacent two of the second flipping units are integrally formed.

12. The motorized hinge drive device according to claim 10, wherein the first rotation arms between the adjacent two of the first flipping units are integrally formed, and the second rotation arms between the adjacent two of the second flipping units are integrally formed.

13. The motorized hinge drive device according to claim 1, wherein the first flip drive assembly and the second flip drive assembly achieve axial clamping by arranging axial securing shoulders at the two ends of the lead screw, or by securely connecting the rotation arms on a same side at a top portion of the first flip drive assembly and a bottom portion of the second flip drive assembly, or by securely connecting the sliders at a top portion of the first flip drive assembly and a bottom portion of the second flip drive assembly.

14. The motorized hinge drive device according to claim 1, wherein in the case that the second flip drive assembly and the first flip drive assembly are positioned on a same side of the nut, the motorized hinge drive device further comprises a connection beam; wherein the first flip drive assembly, the second flip drive assembly, and the nut that are successively arranged along the axial direction of the lead screws are securely connected to the lead screws via the connection beam.

15. A hinge device, comprising: a framework, two connection arms oppositely arranged, and the motorized hinge drive device as defined in claim 1; wherein the motorized hinge drive device is mounted on the framework, a first rotation arm and a second rotation arm of the motorized hinge drive device are both connected to an external device, and two ends of each of the two connection arms is transmissive connection to the framework and the external device.

16. The hinge device according to claim 15, wherein the first rotation arm and the second rotation arm are rotatably or slidably connected to the external device.

17. An electronic device, comprising: a first body, a second body, a triggering module, a smart controller, and the hinge device as defined in claim 15; wherein the triggering module and the smart controller are respectively mounted within the first body and/or the second body; and the hinge device is connected to the first body and the second body;

the triggering module is configured to generate a trigger signal in response to an operation by a user; and the smart controller is configured to, based on the trigger signal, control the hinge device to operate.

18. The electronic device according to claim 17 wherein the triggering module comprises at least one or a combination of two or more of a key module, a fingerprint recognition module, an image acquisition module, or a voice input module.

19. The electronic device according to claim 17, further comprising: a sensor; wherein the sensor is configured to detect a relative position and a relative motion state of the first body and the second body, and/or an acting force exerted by the hinge device to the first body and/or the second body; and the smart controller is configured to, based on information detected by the sensor, determine usage of the electronic device, output a corresponding motor control signal, control the hinge device to operate, and assist the user to operate the electronic device.

* * * * *